(12) United States Patent
Sasagawa et al.

(10) Patent No.: US 7,989,351 B2
(45) Date of Patent: Aug. 2, 2011

(54) METHOD FOR MANUFACTURING A WIRING OVER A SUBSTRATE

(75) Inventors: Shinya Sasagawa, Atsugi (JP); Satoru Okamoto, Isehara (JP); Shigeharu Monoe, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 99 days.

(21) Appl. No.: 12/431,170

(22) Filed: Apr. 28, 2009

(65) Prior Publication Data
US 2009/0206494 A1 Aug. 20, 2009

Related U.S. Application Data

(62) Division of application No. 11/113,264, filed on Apr. 25, 2005, now Pat. No. 7,538,039.

(30) Foreign Application Priority Data

Apr. 28, 2004 (JP) ................................. 2004-134535

(51) Int. Cl.
*H01L 21/302* (2006.01)
(52) U.S. Cl. ................. 438/706; 438/713; 257/E21.582
(58) Field of Classification Search .......... 438/149–151, 438/689–706, 713; 257/E21.311, E21.312, 257/E21.314, E21.582
See application file for complete search history.

(56) References Cited

U.S. PATENT DOCUMENTS

| 5,276,347 | A | | 1/1994 | Wei et al. | |
|---|---|---|---|---|---|
| 5,498,573 | A | * | 3/1996 | Whetten | 438/644 |
| 6,071,821 | A | | 6/2000 | Hirata et al. | |
| 6,201,281 | B1 | * | 3/2001 | Miyazaki et al. | 257/347 |
| 6,515,336 | B1 | | 2/2003 | Suzawa et al. | |
| 6,596,571 | B2 | | 7/2003 | Arao et al. | |
| 6,646,287 | B1 | * | 11/2003 | Ono et al. | 257/66 |
| 6,773,996 | B2 | | 8/2004 | Suzawa et al. | |

(Continued)

FOREIGN PATENT DOCUMENTS

JP 01-159776 6/1989

(Continued)

*Primary Examiner* — Khiem D Nguyen
(74) *Attorney, Agent, or Firm* — Eric J. Robinson; Robinson Intellectual Property Law Office, P.C.

(57) ABSTRACT

A wiring over a substrate capable of reducing particles between wirings and a method for manufacturing the wiring is disclosed. A wiring over a substrate capable of preventing short-circuiting between wirings due to big difference in projection and depression between wirings and a method for manufacturing the wiring is also disclosed. Further, a wiring over a substrate capable of preventing cracks in the insulating layer due to stress at the edge of a wiring or particles and a method for manufacturing the wiring is also disclosed. According to the present invention, a method for manufacturing a wiring over a substrate is provided that comprises the steps of: forming a first conductive layer over an insulating surface; forming a first mask pattern over the first conductive layer; forming a second mask pattern by etching the first mask pattern under a first condition, simultaneously, forming a second conductive layer having a side having an angle of inclination cross-sectionally by etching the first conductive layer; and forming a third conductive layer and a third mask pattern by etching the second conductive layer and the second mask pattern under a second condition; wherein a selective ratio under the first condition of the first conductive layer to the first mask pattern is in a range of 0.25 to 4, and a selective ratio under the second condition of the second conductive layer to the second mask pattern is larger than that under the first condition.

10 Claims, 22 Drawing Sheets

U.S. PATENT DOCUMENTS

| | | |
|---|---|---|
| 6,809,339 B2 | 10/2004 | Suzawa et al. |
| 6,884,664 B2 | 4/2005 | Fujimoto et al. |
| 6,933,184 B2 | 8/2005 | Arao et al. |
| 7,026,194 B2 | 4/2006 | Suzawa et al. |
| 7,026,649 B2 | 4/2006 | Kang et al. |
| 7,071,037 B2 | 7/2006 | Suzawa et al. |
| 7,169,710 B2 | 1/2007 | Yamazaki et al. |
| 7,224,028 B2 | 5/2007 | Suzawa et al. |
| 2004/0087125 A1* | 5/2004 | Monoe .......................... 438/592 |

FOREIGN PATENT DOCUMENTS

| | | |
|---|---|---|
| JP | 05-235338 | 9/1993 |
| JP | 07-297185 | 11/1995 |
| JP | 07-312425 | 11/1995 |
| JP | 2597611 | 4/1997 |
| JP | 11-111702 | 4/1999 |
| JP | 2002-246369 | 8/2002 |

\* cited by examiner

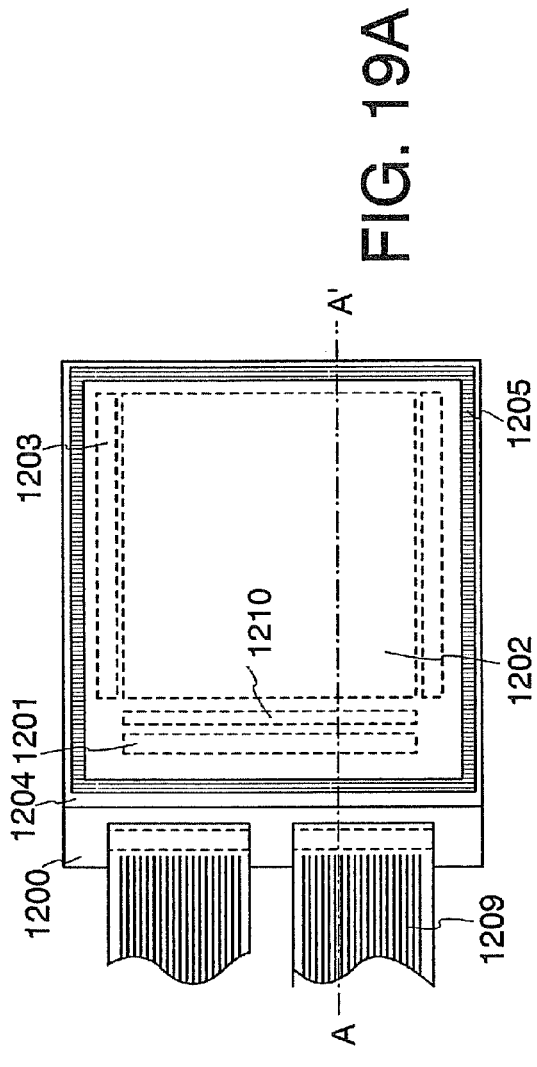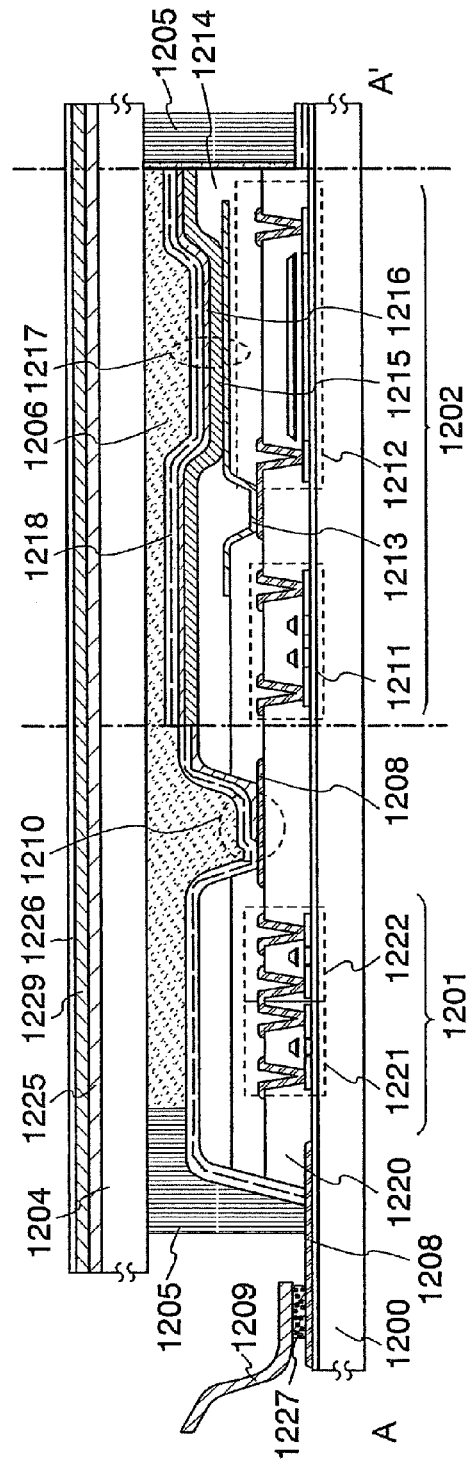

METHOD FOR MANUFACTURING A WIRING OVER A SUBSTRATE

This application is a divisional of application Ser. No. 11/113,264, filed Apr. 25, 2005, now U.S. Pat. No. 7,538,039.

BACKGROUND OF THE INVENTION

1. Field of the Invention

The present invention relates to a method for manufacturing a wiring over a substrate and a semiconductor device having a multi-wire structure.

2. Related Art

In recent years, a wiring over a substrate and a semiconductor device are highly integrated since the degree of integration of a semiconductor element is improved. Accordingly, the width of a wiring is further miniaturized, and the number of wirings is increased. Moreover, an area of the semiconductor device is reduced by being the wiring into multi-wire.

However, there is a problem of disconnection or short-circuiting of the wiring due to particles such as contaminant particles since the space between the wirings becomes narrowed due to the increase of the number of wirings.

In the semiconductor device having a multi-wire structure, the width of the wiring is miniaturized and the density of the wiring is increased, which leads that a difference in projection and depression is increased and the coverage of an insulating layer provided between wirings is deteriorated. Therefore, there is another problem that a lower wiring and an upper wiring are short-circuited.

In the case of forming an insulating layer over the wiring by a coating method, an insulating material is contracted and the stress is concentrated at the edge of the wiring when baking the insulating material. As a result, cracks are produced in the insulating layer, which results in another problem. The cracks in the insulating layer yields problems that irregularities are produced over the surface of the insulating layer; corrosion of the lower wiring due to penetration of moisture from the crack; and short-circuiting of the upper wiring and the lower wiring at the crack.

Further, particles remained between wirings also cause cracks and irregularities over the surface of the insulating layer. In the case of forming a light-emitting element over the insulating layer, an anode and a cathode of the light-emitting element are short-circuited, which leads to the deterioration of the light-emitting element.

When a crack is occurred in a certain portion of the insulating layer, cracks become readily occurred in another regions. That is, cracks become into a chain reaction. As a result, manufacturing yields of the wiring over a substrate and the semiconductor device are reduced.

SUMMARY OF THE INVENTION

In view of the foregoing, it is an object of the present invention to provide a wiring over a substrate capable of reducing particles between wirings and a method for manufacturing the wiring over the substrate. It is another object of the invention to provide a wiring over a substrate capable of preventing short-circuiting between wirings due to a big difference in projection and depression wirings and a method for manufacturing the wiring over the substrate. It is still another object of the invention to provide a wiring over a substrate capable of preventing cracking in the insulating layer due to stress of the edge of a wiring or particles and a method for manufacturing the wiring over the substrate. It is still another object of the invention to provide a method for manufacturing a wiring over a substrate and a semiconductor device having a multi-wire structure at high yields.

According to one aspect of the present invention, a first conductive layer is formed over an insulating layer, a first mask pattern is formed over the first conductive layer, a second conductive layer is formed by etching the first conductive layer under a first condition, and a third conductive layer is formed by etching the second conductive layer under a second condition. In this instance, the first condition is the condition that has a small selective ratio of the first mask pattern to the first conductive layer, whereas the second condition is the condition that has a large selective ratio of the first mask pattern to the second conductive layer.

The present invention provides a method for manufacturing a wiring over a substrate comprising the steps of: forming a first conductive layer over an insulating surface; forming a first mask pattern over the first conductive layer; forming a second mask pattern by etching the first mask pattern under a first condition, simultaneously, forming a second conductive layer having a side having an angle of inclination cross-sectionally by etching the first conductive layer; and forming a third conductive layer and a third mask pattern by etching the second conductive layer and the second mask pattern under a second condition. Moreover, the present invention provides a method for manufacturing a semiconductor device by forming an insulating layer after removing the third mask pattern. Under the first condition, a selective ratio of the first mask pattern to the first conductive layer is in a range of 0.25 to 4, and a selective ratio under the second condition of the first mask pattern to the first conductive layer is larger than that under the first condition.

The present invention provides a method for manufacturing a wiring over a substrate comprising the steps of: forming a first conductive layer over an insulating surface; forming a first mask pattern over the first conductive layer; forming a second mask pattern by etching the first mask pattern under a first condition, simultaneously, forming a second conductive layer having a side, a part of which has an angle of inclination cross-sectionally by etching the first conductive layer; oxidizing a surface of the second conductive layer; and forming a third conductive layer and a third mask pattern by etching the second conductive layer and the second mask pattern under a second condition. Moreover, the present invention provides a method for manufacturing a semiconductor device by forming an insulating layer after removing the third mask pattern. Under the first condition, a selective ratio of the first mask pattern to the first conductive layer is in a range of 0.25 to 4, and a selective ratio under the second condition of the first mask pattern to the first conductive layer is larger than that under the first condition.

Further, the angle of inclination is in a range of 51° to 68°.

The present invention provides a method for manufacturing a wiring over a substrate comprising the steps of: forming a first conductive layer over an insulating surface; forming a first mask pattern over the first conductive layer; forming a second conductive layer having a side having an angle in a range of 85° to 90° cross-sectionally by etching the first conductive layer under a first etching condition; and forming a third conductive layer and a second mask pattern by etching the second conductive layer and the first mask pattern under a second condition. Moreover, the present invention provides a method for manufacturing a semiconductor device by forming an insulating layer after removing the second mask pattern. Under the second condition, a selective ratio of the first mask pattern to the first conductive layer is larger than that under the first condition.

The present invention provides a method for manufacturing a wiring over a substrate comprising the steps of: forming a first conductive layer over an insulating surface; forming a first mask pattern over the first conductive layer; forming a second conductive layer having a side having an angle in a range of 85 to 90° cross-sectionally by etching the first conductive layer under a first etching condition; oxidizing a surface of the second conductive layer; and forming a third conductive layer and a second mask pattern by etching the second conductive layer and the first mask pattern under a second condition. Moreover, the present invention provides a method for manufacturing a semiconductor device by forming an insulating layer after removing the second mask pattern. Under the second condition, a selective ratio of the first mask pattern to the first conductive layer is larger than that under the first condition. Under the second condition, a mixed gas composed of an etching gas used in the first condition and an etching gas that yields a higher selective ratio of the first mask pattern to the first conductive layer than that under the first condition is used. In the case that the first conductive layer is a conductive layer containing aluminum, the etching gas used in the first condition is boron trichloride or chlorine, and the etching gas that yields a higher selective ratio of the first mask pattern to the first conductive layer than that under the first condition is one kind or a plurality of kinds selected from the group consisting of carbon tetrafluoride, sulfur fluoride, and oxygen.

The present invention provides a wiring over a substrate comprising: a wiring formed over an insulating surface; wherein a side of the wiring has a plurality of inclined planes with respect to the insulating surface, a first inclined plane and the insulating surface has an angle in a range of 50 to 70°, a second inclined plane and the insulating surface has an angle in a range of 20 to 60°, and the first inclined plane is in contact with the insulating surface. A region formed by crossing the first inclined plane and the second inclined plane is a side of a layer of the wiring.

The present invention provides a wiring over a substrate comprising: a wiring formed over an insulating surface; wherein a side of the wiring has a curved face.

The present invention provides a semiconductor device comprising: a wiring formed over an insulating surface; and an insulating layer having a step height reduction ratio over the wiring; wherein a side of the wiring has a plurality of inclined planes with respect to the insulating surface, a first inclined plane and the insulating surface has an angle in a range of 50 to 70°, a second inclined plane and the insulating surface has an angle in a range of 20 to 60°, and the first inclined plane is in contact with the insulating surface. A region formed by crossing the first inclined plane and the second inclined plane is a side of a layer of the wiring. The insulating layer having a step height reduction ratio is formed by coating organic resin or siloxane polymer.

The present invention provides a semiconductor device comprising: a wiring formed over an insulating surface; and an insulating layer having a step height reduction ratio over the wiring; wherein a side of the wiring has a curved surface. The insulating layer having a step height reduction ratio is formed by coating organic resin or siloxane polymer.

Since a wiring over a substrate according to the present invention has a side having a curved face or a plurality of inclined planes, particles remained between wirings can be readily washed away when washing the substrate. Therefore, the density of particles of the wiring and the semiconductor device can be reduced. Especially, the density of particles between wirings can be reduced, and so short-circuiting of the wiring and cracking of an upper insulating layer can be reduced.

In the semiconductor device having a multi-wire structure, since a wiring has a side having a curved face or a plurality of inclined planes, a difference in projection and depression between wirings can be reduced and the coverage of an insulating layer formed between multi-wire wirings can be improved. Therefore, short-circuiting between a lower wiring and an upper wiring can be prevented. Further, step height reduction ratio of the insulating layer formed subsequent to forming the wiring can be improved.

Since a wiring has a side and an edge, each of which has a curved face or a plurality of inclined planes, occurrence of stress at the edge of the insulating layer is reduced, and occurrence of cracks in the insulating layer can be reduced. Therefore, corrosion of the lower wiring due to penetration of moisture from the crack and a chain reaction of the cracks can be prevented. Moreover, manufacturing yields of the semiconductor device having a multi-wire structure are reduced.

These and other objects, features and advantages of the present invention will become more apparent upon reading of the following detailed description along with the accompanied drawings.

BRIEF DESCRIPTION OF THE DRAWINGS

FIGS. 19A and 19B are respectively a top view and a cross-sectional view showing a structure of a semiconductor device according to the present invention;

DESCRIPTION OF THE INVENTION

Embodiment 1

In this embodiment, a method for manufacturing a wiring over a substrate comprising a wiring having a side with a curved face by an etching process under a first condition and an etching process under a second condition is explained with reference to FIGS. 1, 3A to 3D, and 7.

Figure 3A:
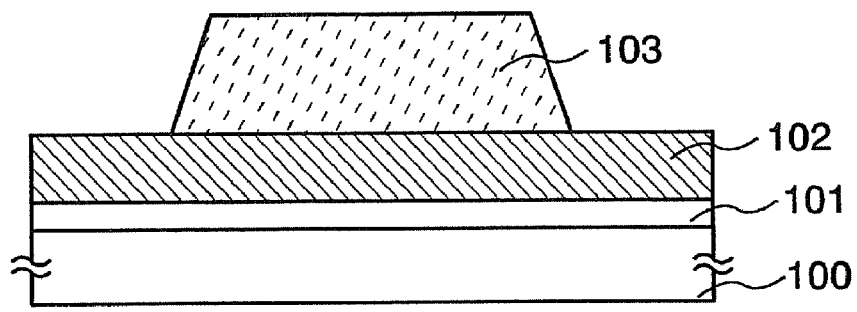
FIGS. 3A to 3D are cross-sectional views for showing a manufacturing process of a wiring over a substrate according to the present invention.

As illustrated in FIG. 3A, a first insulating layer 101 is formed over a substrate 100, and a first conductive layer 102 is formed over the first insulating layer 101. Then, a first mask pattern 103 is formed over the first conductive layer 102 (a step S101 in FIG. 1).

As the substrate 100, a substrate made from an insulating material such as a glass substrate, a quartz substrate, or alumina substrate; a plastic substrate having heat resistance that can resist processing temperature in a later process; a silicon wafer; a metal plate; or the like can be used. In this instance, an insulating film for preventing dispersion of impurities from the substrate such as silicon oxide (SiOx), silicon nitride (SiNx), silicon oxynitride (SiOxNy) (x>y), silicon nitride oxide (SiNxOy) (x>y), or the like may be preferably formed. Alternatively, a substrate that is a metal substrate such as stainless or a semiconductor substrate, each of which is covered by an insulating film such as silicon oxide or silicon nitride, can be used. In the case that the substrate 100 is a glass substrate, a large substrate of 320×400 mm, 370×470 mm, 550×650 mm, 600×720 mm, 680×880 mm, 1000×1200 mm, 1100×1250 mm, or 1150×1300 mm can be used.

In the case that a plastic substrate is used as the substrate 100, plastic having comparative high glass transition point such as PC (poly carbonate), PES (polyethylene sulfone), PET (polyethylene terephthalate), or PEN (polyethylene naphthalate) is preferably used. In this instance, a glass substrate is used as the substrate 100.

The first insulating layer 101 is formed by a material having an insulating property by a known method. Typically, an inorganic insulating material or an organic insulating material is used. Specifically, an organic resin layer can be formed by coating and baking polyimide, polyamide, polyester, acrylic, or the like. Alternatively, $SiO_2$ having the bond of Si—$CH_3$ can be formed by coating PSG (phosphorus glass), BPSG (boron phosphorus glass), silicate SOG (Spin on Glass), polysilazane SOG, alkoxy silicate SOG, siloxane polymer, or the like by a droplet discharging, a coating method, or a printing method to be baked. Silicon nitride, silicon nitride oxide, silicon oxide, or the like can be formed by a PVD method (Physical Vapor Deposition), a CVD method (Chemical Vapor Deposition), a thermal oxide method. A metal oxide such as Ag, Cu, Ni, Pt, Pd, Ir, Rh, W, Al, Ta, Mo, Cd, Zn, Fe, Ti, Si, Ge, Zr, or Ba can be formed by a vapor deposition method, an anode oxidization method, or the like. In this instance, a silicon oxide film is formed by a CVD method.

The first conductive layer 102 can be formed by a droplet discharging method, a printing method, an electroplating method, a PVD method (Physical Vapor Deposition method), a CVD method (Chemical Vapor Deposition method), a vapor deposition method, or the like. As a material for the first conductive layer 102, metal such as Ag, Au, Cu, Ni, Pt, Pd, Ir, Rh, W. Al, Ta, Mo, Cd, Zn, Fe, Ti, Si, Ge, Zr, or Ba: alloys of the metal; or a metal nitride of the metal can be used. Alternatively, a conductive oxide material transparent to light, typically, indium tin oxide (ITO), zinc oxide (ZnO), zinc indium oxide (IZO), zinc oxide doped with gallium (GZO), indium tin oxide containing silicon oxide, organic indium, organic tin, or the like can be appropriately used as the material for the first conductive layer 102. Further alternatively, aluminum containing nickel of 1 to 20% can be used. In this instance, the first conductive layer 102 is formed by aluminum by a sputtering method.

The first mask pattern 103 is preferably formed to have a side edge in a tapered shape (hereinafter, taper portion). The angle of the taper potion is 50 to 80°, preferably, 60 to 70°. The first mask pattern having the taper portion allows that the second conductive layer formed afterwards to be formed into a shape having a taper portion. The first mask pattern can be formed by a photolithography method, a droplet discharging method, a printing method, or the like. In the case that the first mask pattern 103 is formed by a photolithography method, a reduced projection exposure system (commonly known as a stepper) or mirror projection aligner (commonly known as an MPA) can be used as an exposure system. In the case that the reduced projection exposure system is used, a mask pattern may be formed to have a vertical side instead of a tapered portion. In this case, the vertical side may be tapered by a heat treatment at 160 to 200° C. If a mask pattern having a tapered side can be formed, the present invention is not limited to the foregoing exposure systems, but a known exposure system can be freely used.

The side in a tapered shape has a shape having an angle of inclination with respect to the surface of the substrate.

As a material for the first mask pattern 103, organic resin such as acrylic resin, polyimide resin, melamine resin, polyester resin, polycarbonate resin, phenol resin, epoxy resin, polyacetal, polyether, polyurethane, polyamide (nylon), furan resin, diallyl phthalate resin, novolac resin, silicon resin can be appropriately used. In this instance, resist containing polyimide as its main component is used.

Figure 1:
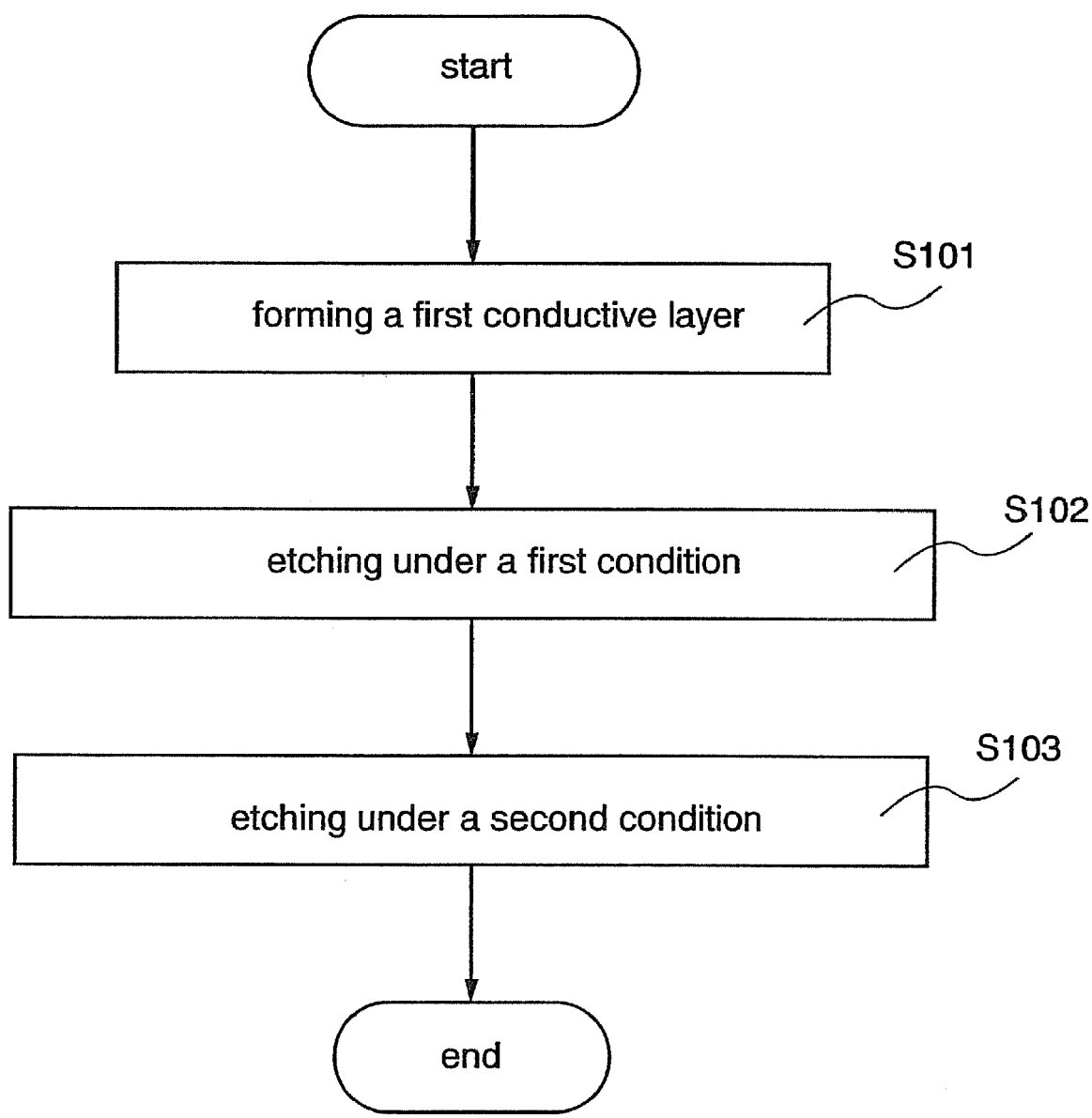
FIG. 1 is a flow chart for showing a manufacturing process of a wiring over a substrate according to the present invention.
Figure 3B:
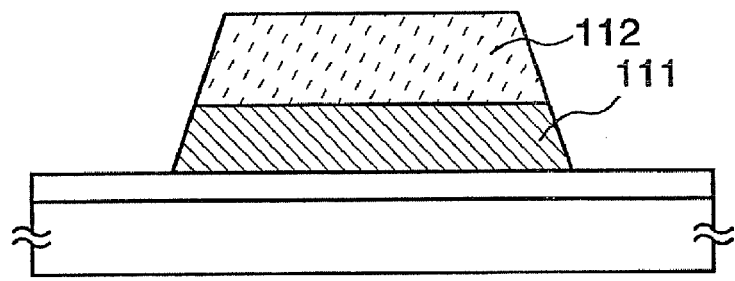

As illustrated in FIG. 3B, the first conductive layer 102 is etched by using the first mask pattern 103 having a taper portion under a first condition to form a second conductive layer 111 having a taper portion (a step S102 in FIG. 1). The first condition is the condition that has a small selective ratio of the first mask pattern 103 to the first conductive layer 102. That is, the etching rate of the first mask pattern 103 is lower than that of the first conductive layer 102. To satisfy such the condition, a material that can etch both of the first mask pattern and the first conductive layer 102 is preferably used as an etching gas. As a result, the second conductive layer having a taper portion can be formed by recessing the first mask pattern 103 and the first conductive layer 102. Since the first mask pattern 103 is recessed at this time, the width is slightly reduced and the thickness is also reduced. The mask pattern is referred to as a second mask pattern 112. In this instance, a chloride gas is used. As a typical example of the chloride gas, boron trichloride, chlorine, or the like can be used.

The condition that has a small selective ratio of the first mask pattern 103 to the first conductive layer 102 is the condition that has a selective ratio of 0.25 to 4. Further, the selective ratio in this instance is a ratio of an etching rate of the first conductive layer 102 to that of the first mask pattern 103.

As a method for etching, an ICP (Inductively Coupled Plasma) etching method, an ECR (Electron Cyclotron Resonance) etching method, an RIE (Reactive Ion Etching) method, a CCP (Capacitively Coupled Plasma) etching method, an SWP (Surface Wave Plasma) etching method, or the like can be appropriately used. In this instance, the ICP etching method is used.

Figure 3C:
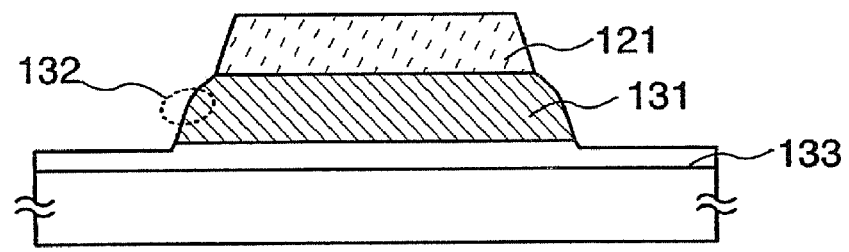
Figure 3D:
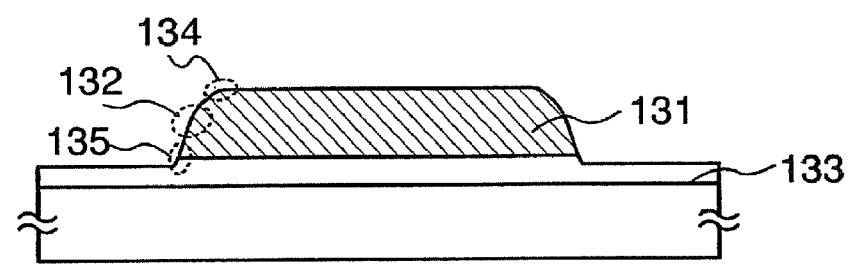

Then, as illustrated in FIG. 3C, the second conductive layer 111 is etched under a second condition while leaving the second mask pattern 112 to form a third conductive layer 131 having a curved surface (a step S103 in FIG. 1). The second condition has larger selective ratio of the second mask pattern 112 to the second conductive layer 111 than that of the first condition. That is, the etching rate of the second mask pattern 112 is higher than that of the second conductive layer 111. To satisfy such the condition, a mixed gas composed of gas that can etch at least the second conductive layer 111 and gas that can etch selectively only the second mask pattern 112 is preferably used. As the etching gas a mixed gas with etching gas that can etch at least the second conductive layer 111 and an etching gas used in the first condition can be appropriately used. Further, as the etching gas that can etch selectively only the second mask pattern 112, carbon tetrafluoride, sulfur fluoride, oxygen, or the like can be nominated. In this instance, a mixed gas of boron trichloride and carbon tetrafluoride is used as the etching gas.

The term as used herein "selective ratio" refers to ratio of an etching rate of the second mask pattern 112 to an etching rate of the second conductive layer 111.

Further, it is preferable to apply bias power to produce self bias voltage at high pressure and to increase ion impact energy. By recessing the second mask pattern 112 by using gas that selectively etches the second mask pattern 112, a third mask pattern 121 is formed. By recessing the mask pattern, the upper edge of the second conductive layer 111 is selectively etched by etching the exposed surface of the second conductive layer 111. As a result, a third conductive layer 131 having a curved surface 132 can be formed. As the etching method, any one of the etching methods nominated in the first condition can be appropriately used.

Further, the exposed region of the first insulating layer 101 is etched and the thickness of the region is slightly reduced. Accordingly, a second insulating layer 133 having difference in thickness is formed.

By removing the third mask pattern 121, the third conductive layer 131 having a curved surface 132 can be formed. Further, in the case that the angle of inclination of the taper portion of the second mask pattern 112 is further reduced, the upper edge of the third conductive layer 131 can be formed to have a curved surface. The upper edge of the conductive layer is a region 134 formed by crossing the top face and the side face of the conductive layer, whereas the lower edge is a region 135 formed by crossing the bottom face and the side face of the conductive layer.

Figure 7:
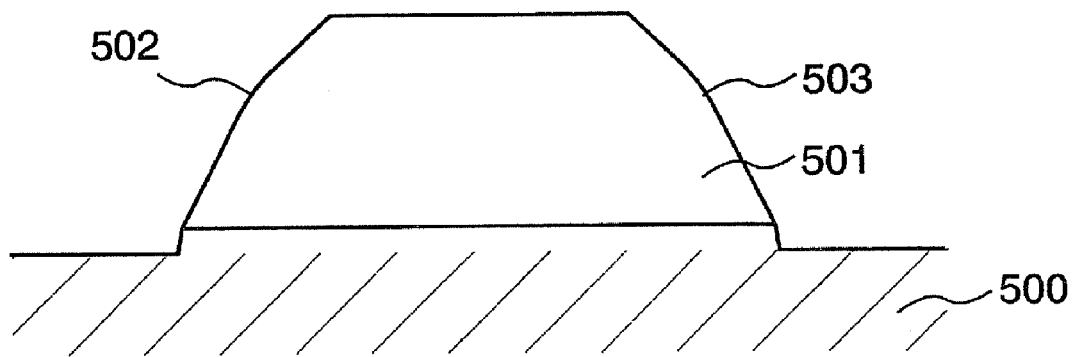
FIG. 7 is a cross-sectional view for showing a shape of a wiring over a substrate according to the present invention.

A cross section shape of the conductive layer formed according to this embodiment is explained with reference to FIG. 7. The side face of the conductive layer 501 on an insulating layer 500 formed according to this embodiment is curved as illustrated in FIG. 7. That is, the side face has curved surfaces 502 and 503.

A wiring over a substrate having such the structure, particles are readily washed away in a process of cleaning after etching treatment. As a result, particles on the wiring and a semiconductor device can be reduced. Particularly, the density of the particle between wirings can be reduced, and so short-circuiting of the wiring and cracking of an upper insulating layer can be reduced.

A difference in projection and depression between wirings can be reduced in a semiconductor device having a multi-wire structure, and so coverage of an insulating layer provided between the wirings can be improved and short-circuiting between a lower layer wiring and an upper layer wiring can be prevented. Moreover, in the case that the insulating layer is formed by a coating method over the upper layer of the wiring, the step height reduction ratio of the insulating layer can be improved, and photolithography of a fine pattern over the insulating layer is possible. As a result, the wiring can be formed into thin and fine, which can lead to high integration.

Embodiment 2

In this embodiment, a method for manufacturing a wiring having a side with a curved face according to a different etching condition from that explained in Embodiment 1 is explained with reference to FIGS. 1, 4A to 4D, and 7.

Figure 4A:
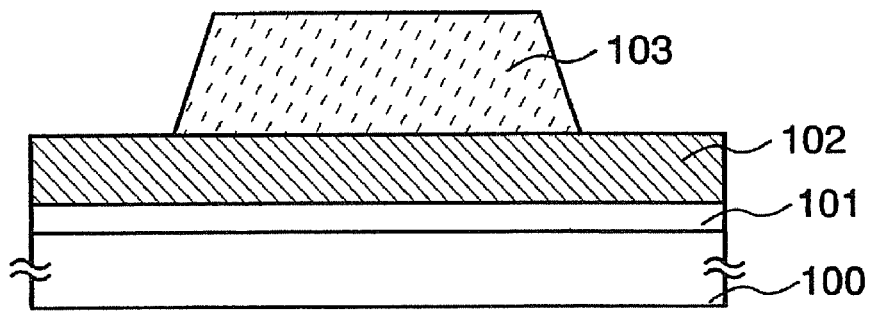
FIGS. 4A to 4D are cross-sectional views for showing a manufacturing process of a wiring over a substrate according to the present invention.

As illustrated in FIG. 4A, as is the case with Embodiment 1, a first insulating layer 101 is formed over a substrate 100, and a first conductive layer 102 is formed over the first insulating layer 101. Then, a first mask pattern 103 is formed over the first conductive layer 102 (a step S101 in FIG. 1).

Figure 4B:
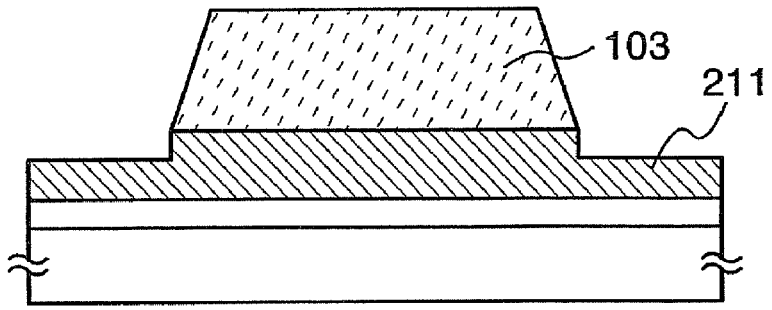

As illustrated in FIG. 4B, the first conductive layer 102 is etched by using the first mask pattern 103 under a first condition to form a second conductive layer 211 having a side perpendicular to the first mask pattern 103 (a step S102 in FIG. 1). The first condition is the condition by which the first conductive layer 102 is anisotropically etched, typically, a conductive layer having a perpendicular side is formed. Further typically, the first condition is the condition by which only the first conductive layer 102 is etched without recessing the first mask pattern 103. In the first condition in this embodiment, self bias voltage is lower and pressure in a reaction chamber is slightly higher than those in the first condition described in Embodiment 1. As a result, although the first mask pattern 103 has a taper portion, the side of the second conductive layer 211, which roughly corresponds to the edge of the first mask pattern, and surface of the second conductive layer 211 not overlapped with the first mask pattern are roughly perpendicular to each other. Further, as the etching method, any one of etching methods nominated in the first condition can be appropriately used.

The first condition in this instance is, specifically; the condition by which a conductive layer that has a projection portion having a side, a part of which has a right angle cross-sectionally is formed. Therefore, since self bias voltage is lower and pressure in a reaction chamber is slightly higher than those in the first condition described in Embodiment 1, the first mask pattern 103 is not etched under the first condition in this embodiment.

The second conductive layer 211 has, specifically; a shape having a projection portion having a side, a part of which has a right angle cross-sectionally. Further, the expression "projection portion having a side, a part of which has a right angle cross-sectionally" refers that a part of the cross-section of the side has an angle of inclination of 85° to 90° with respect to a surface of the substrate 100.

Figure 4C:
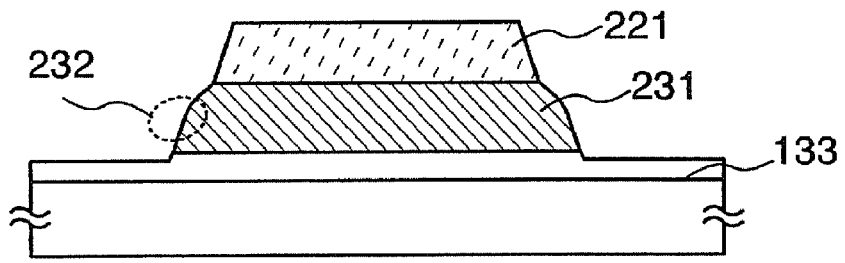

As illustrated in FIG. 4C, the second conductive layer 211 is etched according to a second condition while leaving the first mask pattern 103 to form a third conductive layer 231 having a curved surface 232 (a step S103 in FIG. 1). The second condition is the same as that explained in Embodiment 1. The second condition has a higher selective ratio of the first mask pattern 103 to the second conductive layer 211 than that in the first condition. That is, an etching rate of the first mask pattern 103 is higher than that of the second conductive layer 211. By etching under the second condition, the first mask pattern 103 is selectively etched to form a second mask pattern 221. By etching the surface of the second conductive layer 211 that is exposed by etching the first mask pattern, the upper edge of the second conductive layer is more selectively etched than the lower edge of the second conductive layer. As a result, a third conductive layer 231 having a curved surface 232 can be formed. As the etching method, any one of etching methods nominated in the first condition can be appropriately used.

An exposed region of the first insulating layer 101 is etched, and the thickness of the first insulating layer 101 is slightly reduced. Accordingly, a second insulating layer 133 having difference in level is formed.

Figure 4D:
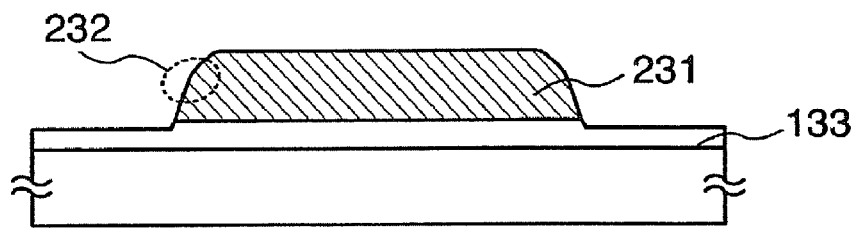

As illustrated in FIG. 4D, a wiring over a substrate provided with the third conductive layer 231 having a curved surface 232 can be formed by removing the second mask pattern 221. Also in this embodiment, the upper edge of the third conductive layer 231 can be formed to have a curved surface 232 by reducing the angle of inclination of the taper portion of the first mask pattern 103.

The cross-section shape of the conductive layer formed according to this embodiment is, as is the case with Embodiment 1, a shape having curved surfaces 502 and 503 as illustrated in FIG. 7. A wiring having such the structure and a semiconductor device having a multi-wire structure have an advantageous effect as is the case with Embodiment 1.

Embodiment 3

In this embodiment, a method for manufacturing a wiring having a side having a plurality of inclined planes according to a different etching process from that in Embodiments 1 and 2 is explained with reference to FIGS. 2, 5A to 5F, and 8.

Figure 5A:
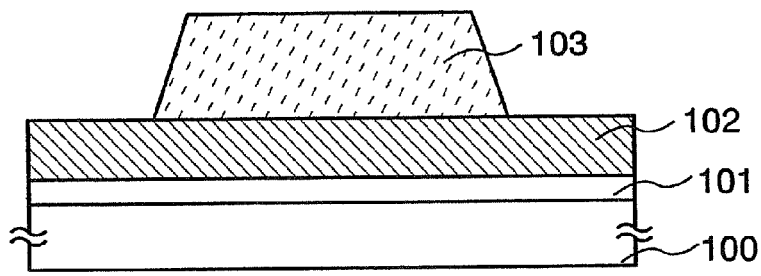
FIGS. 5A to 5F are cross-sectional views for showing a manufacturing process of a wiring over a substrate according to the present invention.

As illustrated in FIG. 5A, a first insulating layer 101 is formed over a substrate 100 as is the case with Embodiment 1, and a first conductive layer 102 is formed over the first insulating layer 101. Then, a first mask pattern 103 is formed over the first conductive layer 102 (a step S101 in FIG. 2).

Figure 2:
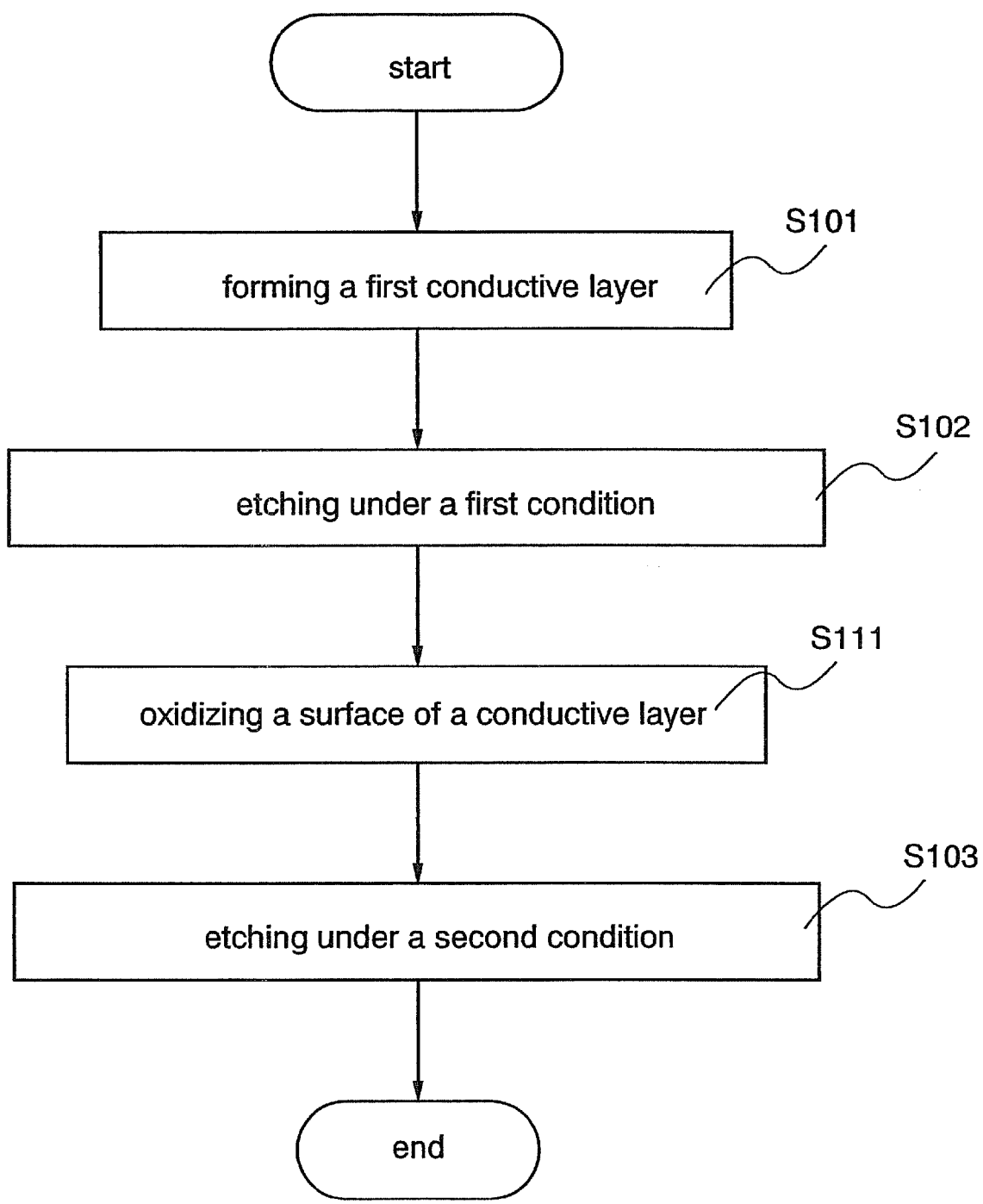
FIG. 2 is a flow chart for showing a manufacturing process of a wiring over a substrate according to the present invention.
Figure 5B:
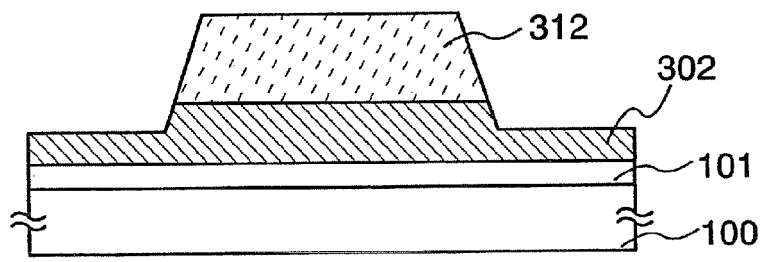

As illustrated in FIG. 5B, the first conductive layer 102 is etched by using the first mask pattern 103 under a first condition to form a second conductive layer 302 (a step S102 in FIG. 2). The first condition is the condition by which the first conductive layer 102 is etched, therefore, a conductive layer having a tapered edge is formed. In this instance, the first condition in this example is the same as that in Embodiment 1. Note that a second conductive layer 302 is formed by etching a part of the first conductive layer 102 in shorter time than that of the first etching process in Embodiment 1. At this time, the first mask pattern 103 is recessed, and so the width and the thickness of the first mask pattern 103 are slightly reduced. Such the mask pattern is referred to as a second mask pattern 312. As an etching method, any one of etching methods nominated in the first condition can be appropriately used.

The first condition in this instance is, specifically; the condition by which a conductive layer that has a projection portion having a side having cross-sectionally a tapered shape is formed. As a result, the second conductive layer 302 has the side, which roughly corresponds to the edge of the first mask pattern, and the side and a part of a surface of the second conductive layer 302, which is not overlapped with the first mask pattern, are not perpendicular to each other. That is, the second conductive layer 302 has a projection portion having a side that is not cross-sectionally perpendicular to the first mask pattern.

Figure 5C:
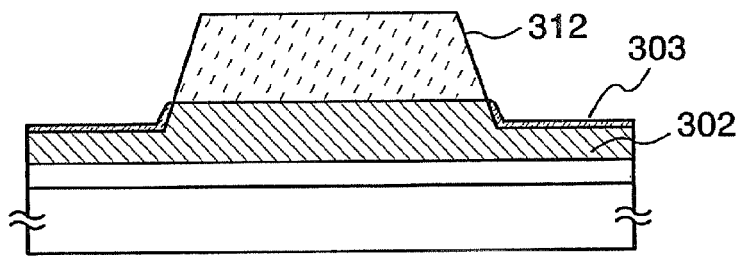

As illustrated in FIG. 5C, an oxide layer 303 is formed by oxidizing the surface of the second conductive layer 302 (a step S111 in FIG. 2). As a method for forming the oxide layer, a method of forming an oxide layer by washing the surface of the second conductive layer 302 with water or ozone water; a method of forming an oxide layer by oxidizing the second conductive layer 302 by exposing the substrate into the air; a method of forming an oxide by oxidizing the surface of the second conductive layer 302 by heating at appropriate temperature; or the like can be used. By using the method of washing the surface of the second conductive layer 302 with water or ozone water as the method for forming an oxide, particles over the substrate can be washed away.

Figure 5D:
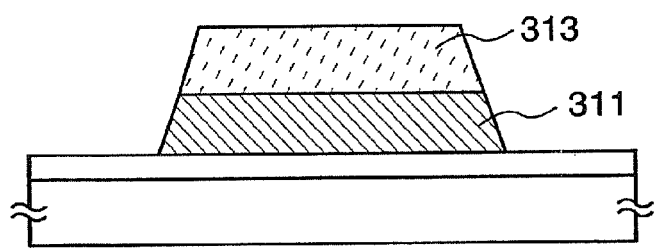

As illustrated in FIG. 5D, a third conductive layer 311 having a tapered edge is formed by etching the second conductive layer 302 by the first etching condition. Since the oxide layer 303 is formed over the surface of the second conductive layer 302, higher bias power is preferably applied and higher self bias voltage is preferably produced in the first condition. As a result, the second conductive layer 302 can be etched in less time. Further, an oxide layer 303 is exposed in the direction perpendicular to the surface of the substrate 100, and so the oxide layer 303 is also etched. In addition, the second mask pattern 312 is also etched; accordingly, the width and the thickness of the second mask pattern 312 are slightly reduced. Such the mask pattern is referred to as a third mask pattern 313.

Since the cross-section of the projection portion of the second conductive layer is formed into a tapered shape, the oxide layer 303 in the taper portion is etched by an anisotropically etched.

Figure 5E:
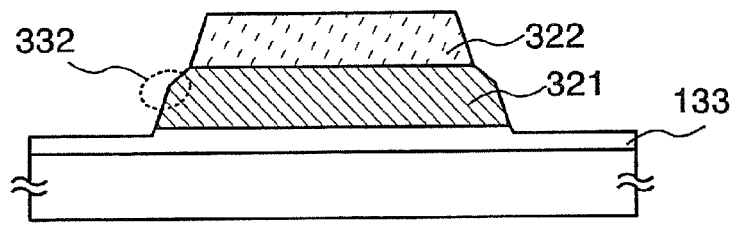

As illustrated in FIG. 5E, a third conductive layer 311 is etched under a second condition while leaving the third mask pattern 313 to form a fourth conductive layer 321 having different inclined planes 332 (a step S103 in FIG. 2). The second condition is the same as that in Embodiment 1. The second condition has a high selective ratio of the first mask pattern to the first conductive layer. By etching under the second condition, the third mask pattern 313 is selectively etched to form a fourth mask pattern 322, and an exposed upper edge of the third conductive layer 311 is etched selectively than the lower edge of the third conductive layer 311. As a result, a fourth conductive layer 321 having different inclined planes 322 can be formed. As an etching method, any one of etching methods nominated in the first condition can be appropriately used.

An exposed region of the first insulating layer 101 is etched, and the thickness of the first insulating layer 101 is slightly reduced. Accordingly, a second insulating layer 133 having difference in level is formed.

Figure 5F:
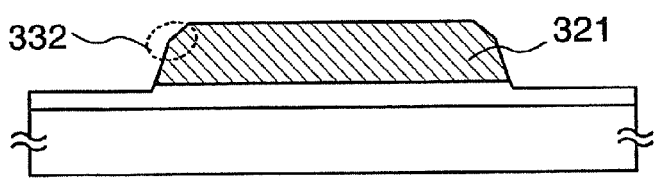

As illustrated in FIG. 5F, the fourth conductive layer 321 having different inclined planes 332 can be formed by removing the fourth mask pattern 322.

Figure 8:
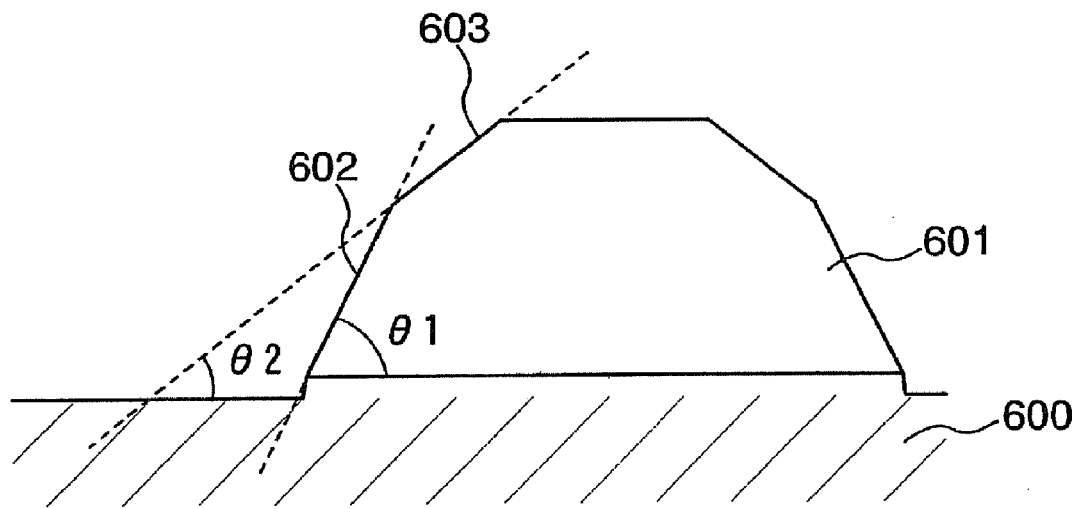
FIG. 8 is a cross-sectional view for showing a shape of a wiring over a substrate according to the present invention.

A shape of a cross-section of a conductive layer formed according to this embodiment is explained with reference to FIG. 8. The side of a conductive layer 601 formed according to a process according to this embodiment has a first inclined plane 602 and a second inclined plane 603 as illustrated in FIG. 8. An angle formed by the first inclined plane 602 and the surface of an insulating layer 600 is referred to as θ1, whereas an angle formed by a plane by extending the second inclined plane 603 and the surface of the insulating layer 600 is referred to as θ2. The θ1 is in a range of 50 to 70°, whereas θ2 is in a range of 20 to 60°, preferably, in a range of 38 to 54°.

By forming the conductive layer by the process according to this embodiment, a region formed by the first inclined plane 602 and the second inclined plane 603 can be formed by not only an interface of layers, each of which is made from different materials, but also a side face of a layer made from the same material.

Particles on a wiring having such the structure are readily washed away by performing a washing process in a process for forming an oxide layer after a first etching treatment. As a result, particles on the wiring over the substrate and a semiconductor device can be reduced. Especially, the density of particles between wirings can be reduced, and so short-circuiting of the wirings and cracking in an upper insulating layer can be reduced.

A difference in projection and depression between wirings can be reduced in a semiconductor device having a multi-wire structure, and so coverage of an insulating layer provided between the wirings can be improved and short-circuiting between a lower layer wiring and an upper layer wiring can be prevented. Moreover, in the case that the insulating layer is formed by a coating method over the upper layer of the wiring, the step height reduction ratio of the insulating layer can be improved, and exposure of a fine pattern over the insulating layer is possible. As a result, the wiring can be formed into fine, which can lead to high integration.

Embodiment 4

In this embodiment, a method for manufacturing a wiring having a side having a plurality of inclined planes by an etching condition that is different from that described in Embodiment 3 is explained with reference to FIGS. 2, 6A to 6E, and 8.

Figure 6A:
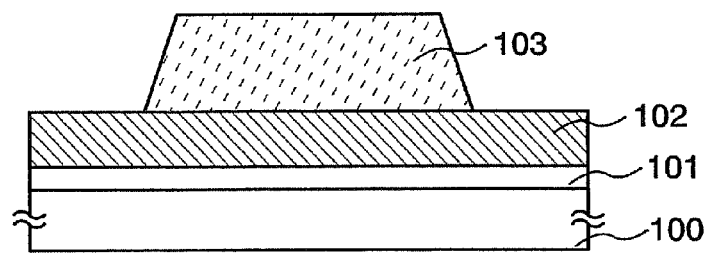
FIGS. 6A to 6E are cross-sectional views for showing a manufacturing process of a wiring over a substrate according to the present invention.

As illustrated in FIG. 6A, as is the case with Embodiment 1, a first insulating layer 101 is formed over a substrate 100, and a first conductive layer 102 is formed over the insulating layer 101. Then, a first mask pattern 103 is formed over the first conductive layer 102 (a step S101 in FIG. 2).

Figure 6B:
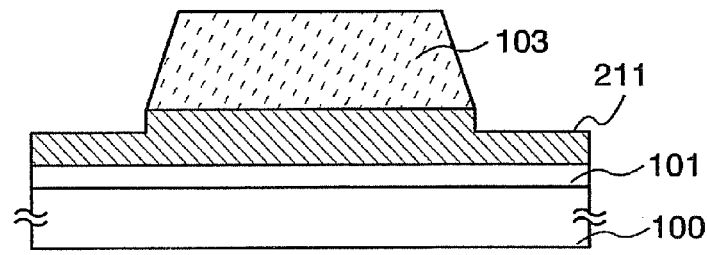

As illustrated in FIG. 6B, the first conductive layer 102 is etched by using the first mask pattern 103 under a first condition to form a second conductive layer 211. As with the first condition described in Embodiment 2, the first condition is the condition by which the first conductive layer is anisotropically etched, typically, a conductive layer having a perpendicular side to the surface of the substrate 100 is formed. As a result, the second conductive layer 211 has the side, which roughly corresponds to the edge of the first mask pattern 103, and which is roughly perpendicular to the surface of the second conductive layer 211 that is not overlapped with the first mask pattern 103 (a step S102 in FIG. 2).

The first condition in this instance is, specifically; the condition by which a conductive layer that has a projection portion having a side having cross-sectionally a right angle to the surface of the substrate 100 is formed. The second conductive layer 211 has a shape having a projection portion having a side having cross-sectionally a right angle.

Figure 6C:
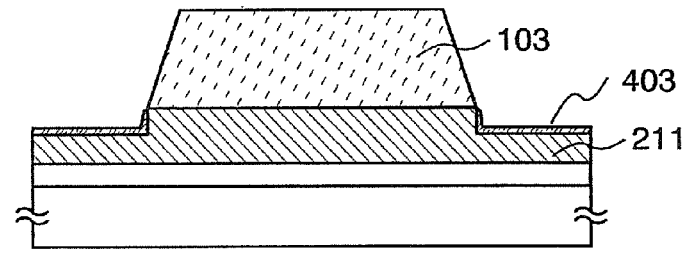

As illustrated in FIG. 6C, an oxide layer 403 is formed by oxidizing the surface of the second conductive layer 211 (a step S111 in FIG. 2). As a method for forming an oxide layer 403, a method of forming an oxide layer by washing the surface of the second conductive layer 302 with water or ozone water; a method of forming an oxide layer by oxidizing the second conductive layer 211 by exposing the substrate into the air; a method of forming an oxide layer by oxidizing the surface of the second conductive layer 211 by heating at appropriate temperature; or the like can be used. By adopting the method of washing the surface of the second conductive layer 211 with water or ozone water as the method for forming an oxide layer, particles over the substrate can be washed away.

Figure 6D:
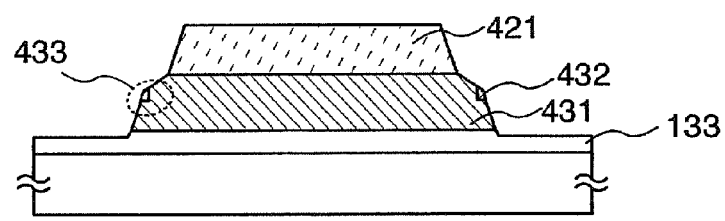

As illustrated in FIG. 6D, a second conductive layer 211 is etched under a second condition while leaving the first mask pattern 103 to form a third conductive layer 431 having different inclined planes 433 (a step S103 in FIG. 2). The second condition is the same as that in Embodiment 1. The second condition has a higher selective ratio of the first mask pattern 103 to the second conductive layer 211 than that of the first condition. That is, an etching rate of the first mask pattern 103 is higher than that of the second conductive layer 211. By etching using the second condition, the first mask pattern 103 is selectively etched to form a second mask pattern 421. That is, an exposed surface of the third conductive layer 431 is etched to selectively etch more the upper edge of the conductive layer than the lower edge of the conductive layer. As a result, a third conductive layer 431 having different inclined planes 433 can be formed. As an etching method, any one of etching methods nominated in the first condition can be appropriately used.

According to the second condition, an oxide layer 403 formed over a plane of the second conductive layer 211 parallel to the substrate is etched. On the other hand, only an upper portion of an oxide layer 403 formed over a perpendicular plane at the lower edge of the first mask pattern 103 is etched, and so an oxide 432 is remained at the side face of the third conductive layer 431.

Further, the exposed region of the first insulating layer 101 is over etched and the thickness of the region is slightly reduced. Accordingly, a second insulating layer 133 having steps is formed.

Figure 6E:
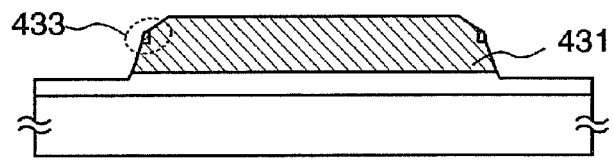

As illustrated in FIG. 6E, the third conductive layer 431 having a plurality of inclined planes 433 can be formed by removing the second mask pattern 421.

A shape of a cross-section of a conductive layer formed according to this embodiment is explained with reference to FIG. 8. As is the case with Embodiment 3, the side of a conductive layer 601 formed according to a process according to this embodiment has a first inclined plane 602 and a second inclined plane 603 as illustrated in FIG. 8. An angle formed by the first inclined plane 602 and the surface of an insulating layer 600 is referred to as θ1, whereas an angle formed by a plane formed by extending the second inclined plane 603 and the surface of the insulating layer 600 is referred to as θ2. The θ1 is in a range of 50° to 70°, whereas θ2 is in a range of 20° to 60°, preferably, in a range of 21° to 35°. A wiring having such the structure and a semiconductor device having a multi-wire structure have an advantageous effect as is the case with Embodiment 1.

By forming the conductive layer by the process according to this embodiment, a region formed by the first inclined plane 602 and the second inclined plane 603 can be formed by not only a side face of a layer made from different materials but also a side face of a layer made from the same material.

EXAMPLE 1

In this example, a process for forming a wiring by using an etching method described in Embodiment 1 is explained with reference to FIGS. 3A to 3D, 9A, and 9B.

As illustrated in FIG. 3A, a first insulating layer 101 is formed over a substrate 100, and a first conductive layer 102 is formed over the first insulating layer 101. In this instance, Corning 1737 glass is used as the substrate 100. As the insulating layer 101, a silicon oxide film is formed by using argon and oxygen as a sputtering gas (the flow ratio 1:3, respectively) by a sputtering method using a silicon target to have a thickness of 100 nm. As the first conductive layer 102, a conductive layer is formed to have a laminated structure by sequentially stacking over the insulating layer 101 a titanium layer with a thickness of 100 nm, an aluminum-silicon alloy film with a thickness of 700 nm, and a titanium film with a thickness of 100 nm by a sputtering method. The titanium film is deposited by a sputtering method with a titanium target and an argon gas. Further, the aluminum-silicon alloy film is deposited by a sputtering method using an argon gas and an aluminum target including silicon of 2 wt %.

Then, a first mask pattern 103 is formed on the first conductive layer 102 by a photolithography process. In this instance, resist is coated over the first conductive layer 102 to be pre-baked at 50 to 150° C. Thereafter, the pre-baked resist is exposed by using a photomask and developed by using developer. Consequently, the first mask pattern 103 is formed.

Figure 23:
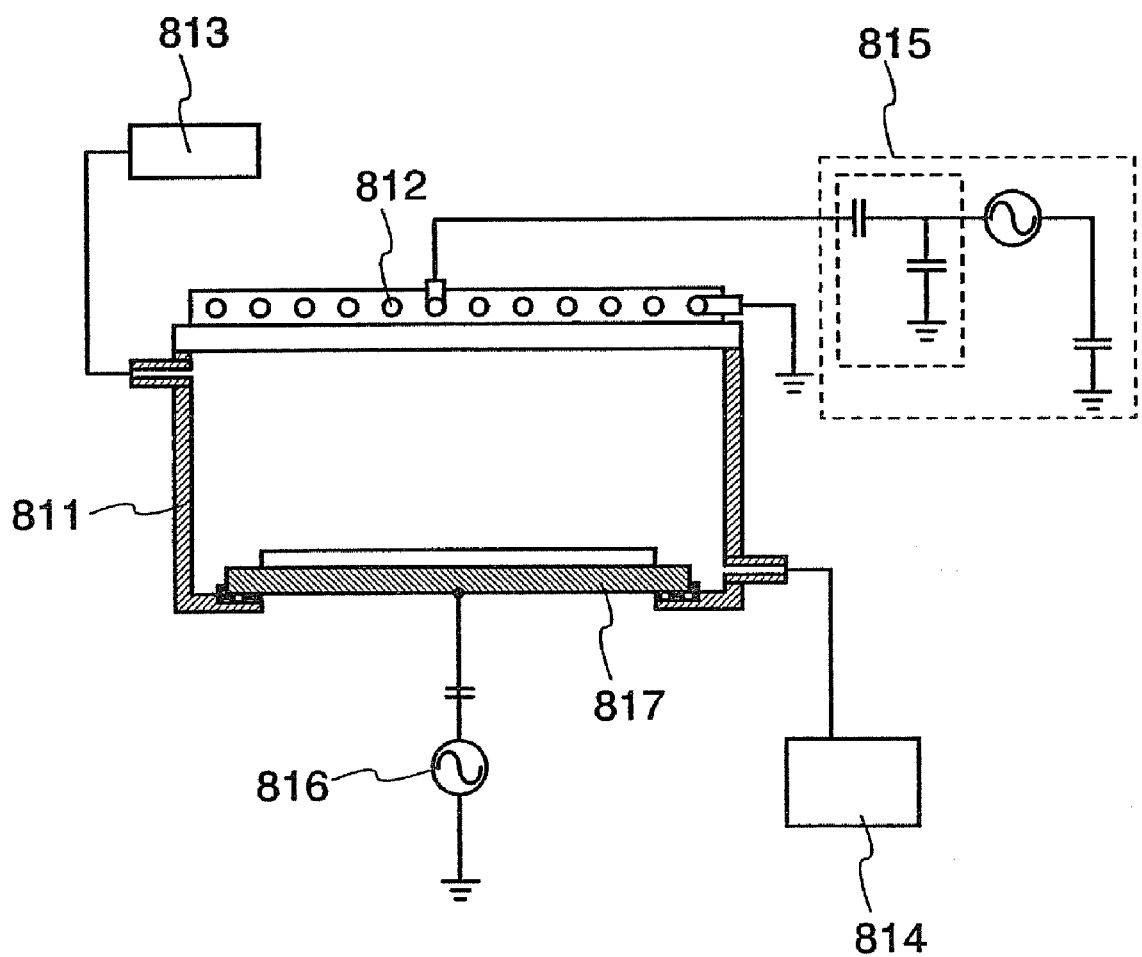
FIG. 23 is a cross-sectional view for showing an etching equipment that can be applied to the present invention.

And then, the first conductive layer 102 is etched under a first condition to form a second conductive layer 111. As the etching processing, an ICP etching equipment is used. FIG. 23 illustrates the structure of the ICP etching equipment. A reaction chamber 811 is coupled with an etching gas supply means 813 and an exhaust means 814 for keeping the reaction chamber under reduced pressure. A plasma generation means is composed of a spiral coil 812 that is inductively coupled to the reaction chamber 811 via a quartz substrate, and a high frequency (13.56 MHz) power supply means 815. Bias power is applied to the substrate by a high frequency (13.56 MHz) power supply means 816 so that a lower electrode 817 mounted with a substrate produces self bias. The etching processing uses etching gaseous species that are to be supplied; high-frequency power that is supplied from each of the high frequency (13.56 MHz) power supply means 815 and 816; and etching pressure as its main parameters.

In this example, a first etching processing is carried out under the following conditions: $BCl_3$ and $Cl_2$ are used as an etching gas at a gas flow ratio of 60:20 (sccm), plasma is produced by applying RF (13.56 MHz) power of 450 W at pressure of 1.9 Pa to a coiled electrode, RF (13.56 MHz) power of 100 W is applied to the substrate side (lower electrode 817), and substantial negative bias power is applied to produce self bias voltage. An etching rate for titanium is about the same as that of aluminum-silicon alloys. As a result, as illustrated in FIG. 3B, a second conductive layer 111 having a tapered portion in its edge is formed. By the first etching process, the first mask pattern 103 is etched, and the width and the thickness thereof are reduced. Such a mask pattern is referred to as a second mask pattern 112. Different from the first conductive layer 102, the second conductive layer 111 is formed as an isolated pattern having a desired shape over the surface of the substrate.

A third mask pattern 121 is formed by recessing the second mask pattern 112 under the second condition, simultaneously, the upper edge of the second conductive layer 111 is etched to form a third conductive layer 131. In this example, the second etching processing is carried out under the second conditions, that is, an ICP etching method is used, $BCl_3$ and $CF_4$ are used as an etching gas at a gas flow ratio of 40:40 (sccm), plasma is produced by applying RF (13.56 MHz) power of 500 W at pressure of 1.9 Pa to a coiled electrode, RF (13.56 MHz) power of 300 W is applied to the substrate side (lower electrode), and substantial negative bias power is applied to produce self bias voltage. An etching rate of the second mask pattern 112 is higher than that of the second conductive layer when using the $CF_4$ as the etching gas, that is, a the second mask pattern 112 has a higher etching rate than that of the second conductive layer 111. In the second condition, bias power is applied so that higher self bias voltage can be produced than that in the first conditions. As a result, the second mask pattern 112 can be selectively recessed.

As recessing the second mask pattern 112, the surface of the upper portion of the second conductive layer 111 becomes exposed. The exposed region is gradually etched. As a result, as illustrated in FIG. 3C, a third conductive layer 131 having a curved edge 132 is formed. Since the exposed insulating layer 101 is also etched, the thickness of the exposed insulating layer 101 is slightly reduced than that of the other region of the insulating layer 101 that is overlapped with the third conductive layer 131.

Figure 9A:
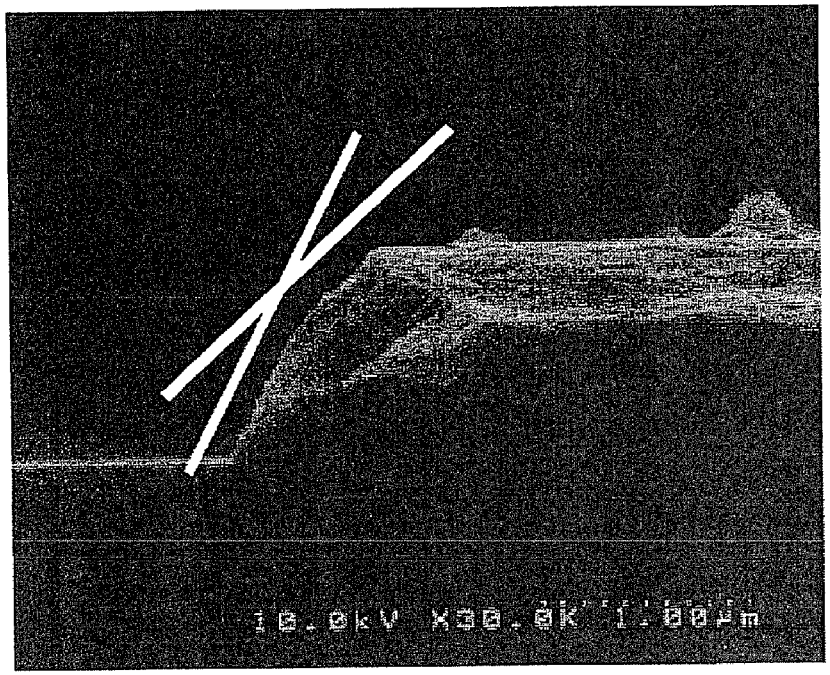
FIGS. 9A and 9B are cross-sectional views for showing a shape of a wiring over a substrate according to the present invention.
Figure 9B:
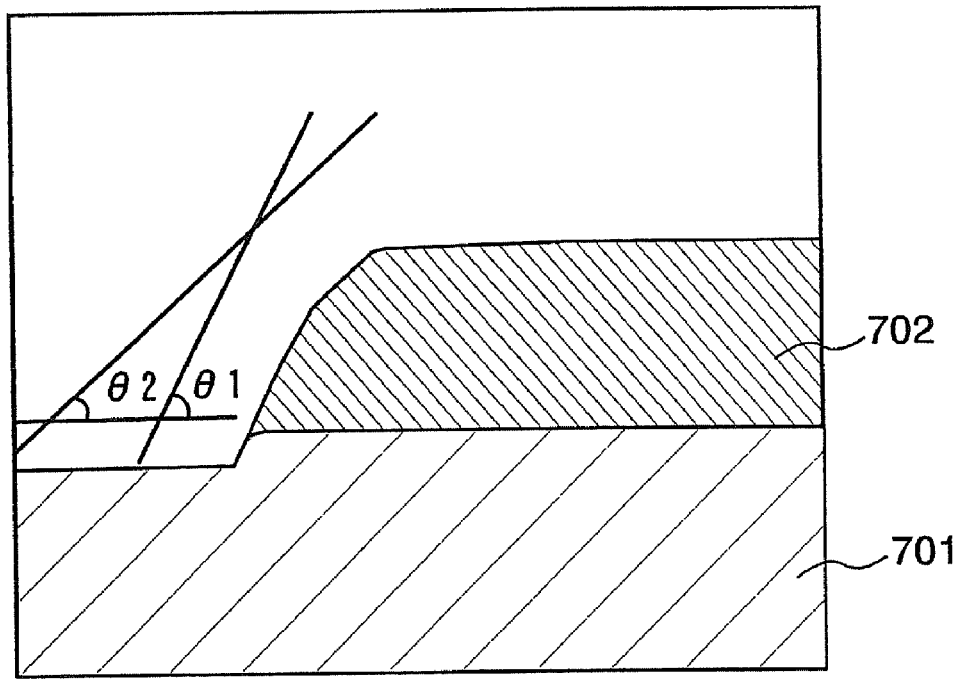

Then, a wiring over a substrate having the third conductive layer 131 can be manufactured by removing the third mask pattern 121 by stripper. FIGS. 9A and 9B illustrate respectively an SEM view and a schematic view thereof of the third conductive layer 131.

FIG. 9A is an SEM view of the cross-section of the third conductive layer 131, whereas FIG. 9B is a schematic view thereof. A third conductive layer 702 is formed over an insulating layer 701. It can be found that the edge of the third conductive layer 702 is curved.

The third conductive layer 702 formed according to this example has a curved surface. The curved surface is formed by crossing of different inclined planes, which becomes to have a gently curved surface. A first inclined plane is formed at a lower part of the side of the third conductive layer 702. The angle formed by the surface of the insulating layer 701 and a first inclined plane is referred to as $\theta 1$. On the other hand, a second inclined plane is formed at an upper part of the side of the third conductive layer 702. The angle formed by the insulating layer 701 and the second inclined plane is referred to as $\theta 2$. In this instance, $\theta 1$ is 62°, whereas $\theta 2$ is 44°.

Table 1 lists the angles $\theta 1$ and $\theta 2$ formed by each of the different inclined planes of the conductive layer formed by the etching method as explained in Embodiment 1 and the insulating layer.

TABLE 1

| $\theta 1(°)$ | $\theta 2(°)$ |
| --- | --- |
| 64 | 44 |
| 57 | 42 |
| 68 | 44 |
| 65 | 48 |
| 61 | 42 |
| 56 | 47 |
| 65 | 49 |
| 66 | 48 |
| 58 | 41 |
| 58 | 41 |
| 62 | 42 |
| 64 | 43 |
| 62 | 42 |
| 62 | 33 |
| 57 | 41 |
| 51 | 38 |
| 54 | 39 |
| 51 | 41 |

According to the above processes, a conductive layer having a curved surface can be formed.

EXAMPLE 2

In this example, a process of forming a wiring by an etching method explained in Embodiment 2 is explained with reference to FIGS. 4A to 4D, 10A, and 10B.

As illustrated in FIG. 4A, as is the case with Example 1, a first insulating layer 101 is formed over a substrate 100, and a first conductive layer 102 is formed over the insulating layer 101. Then, as is the case with Example 1, a first mask pattern 103 is formed over the first conductive layer 102 by a photolithography process.

And then, the first conductive layer 102 is etched under a first condition to form a second conductive layer 211. In this example, a part of the first conductive layer 102 is anisotropically etched by a first etching processing under a first condition, that is, an ICP etching method is used, $BCl_3$ and $Cl_2$ are used as an etching gas at a gas flow ratio of 40:40 (sccm), plasma is produced by applying RF (13.56 MHz) power of 700 W at pressure of 1.9 Pa to a coiled electrode, RF (13.56 MHz) power of 50 W is applied to the substrate side (lower electrode), and substantial negative bias power is applied to produce self bias voltage.

As a result, as illustrated in FIG. 4B, a second conductive layer 211 is formed to have a shape, a part of a side of the shape is perpendicular to a lower edge of the first mask pattern 103. In this example, since self bias voltage is lower than that in the first condition of Example 1, only the first conductive layer 102 is anisotropically etched without etching the first mask pattern 103. Different from the second conductive layer 111 in Example 1, the second conductive layer 211 is formed over an entire surface of the substrate 100, and having a convex shape.

The first mask pattern 103 is recessed by a second condition to form a second mask pattern 221, simultaneously, the upper edge of the second conductive layer 211 is etched to form a third conductive layer 231. In this example, the second condition in Example 1 is used as the second condition in this example. As a result, the surface of the upper portion of the second conductive layer becomes exposed. The exposed region is gradually etched. As a result, as illustrated in FIG. 4C, a third conductive layer 231 is formed to have an edge having a curved surface 232. In this instance, a part of the exposed first insulating layer 101 is also etched, and a second insulating layer 133 having difference in level is formed. The thickness of the region of the insulating layer 101 that is not overlapped with the third conductive layer 231 is slightly reduced than that of the insulating layer 101 that is overlapped with the third conductive layer 231.

Figure 10A:
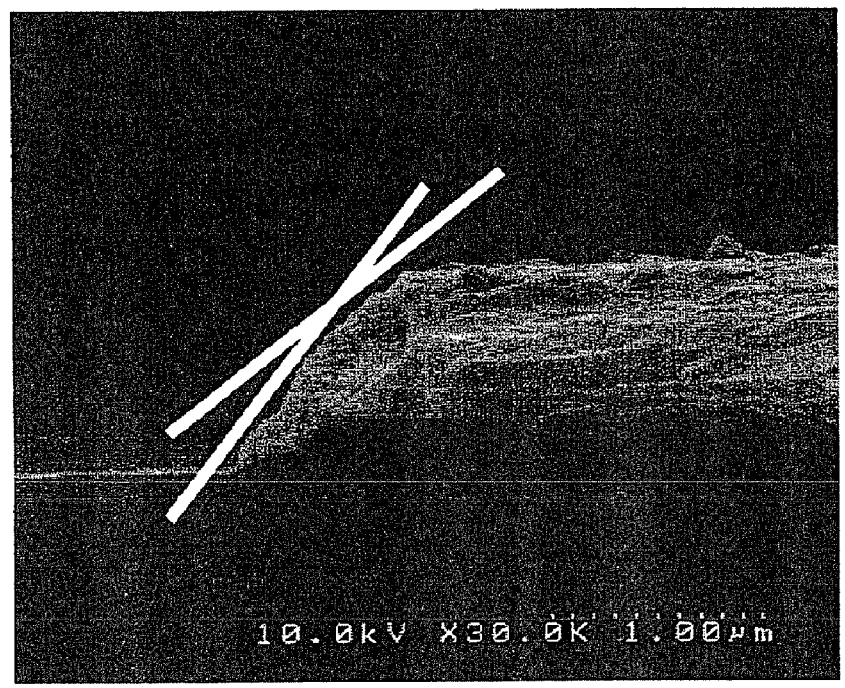
FIGS. 10A and 10B are cross-sectional views for showing a shape of a wiring over a substrate according to the present invention.
Figure 10B:
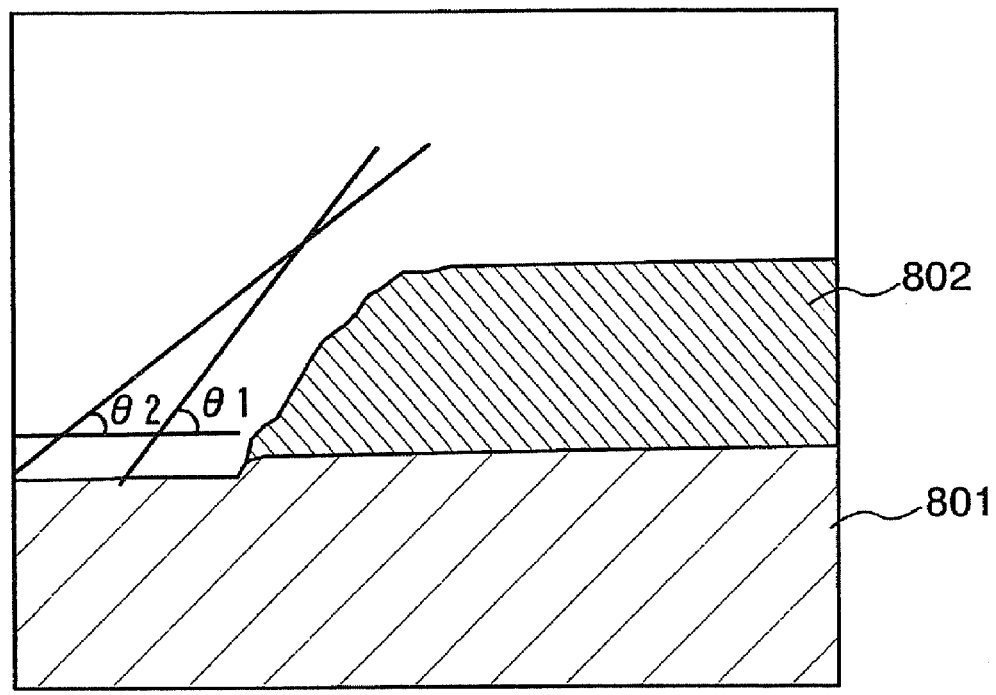

Then, a wiring over a substrate having the third conductive layer 231 can be manufactured by removing the second mask pattern 221 by stripper. FIGS. 10A and 10B illustrate respectively an SEM view and a schematic view thereof of the third conductive layer 231.

FIG. 10A is an SEM view of the cross-section of the third conductive layer, whereas FIG. 10B is a schematic view thereof. A third conductive layer 802 is formed over an insulating layer 801. It can be found that the side of the third conductive layer 802 is curved as is the case with Example 1.

The third conductive layer 802 formed according to this example has a curved surface. The curved surface is formed by crossing of different inclined planes, which becomes to have a gently curved surface. A first inclined plane is formed at a lower part of the side of the third conductive layer 802. The angle formed by the surface of the insulating layer 801 and a first inclined plane is referred to as $\theta 1$. On the other hand, a second inclined plane is formed at an upper part of the side of the third conductive layer 802. The angle formed by the insulating layer 801 and the second surface is referred to as $\theta 2$. In this instance, $\theta 1$ is 53°, whereas $\theta 2$ is 40°.

Table 2 lists the angles $\theta 1$ and $\theta 2$ formed by each of the different inclined planes of the conductive layer formed by the etching method as explained in Embodiment 2 and the insulating layer.

TABLE 2

| $\theta 1(°)$ | $\theta 2(°)$ |
|---|---|
| 60 | 43 |
| 64 | 46 |
| 59 | 37 |
| 56 | 42 |
| 53 | 37 |
| 66 | 36 |
| 55 | 35 |
| 56 | 40 |

According to the above processes, the conductive layer having a curved surface can be formed.

EXAMPLE 3

In this example, a process of forming a wiring by an etching method explained in Embodiment 3 is explained with reference to FIGS. 5A to 5E, 11A, and 11B. In this example, a first condition and a second condition which are the same as those explained in Example 1 are used to etch a conductive layer. Further, a process for oxidizing the surface of the conductive layer is included in these conditions.

A first insulating layer 101 is formed over a substrate 100, and a first conductive layer 102 is formed over the first insulating layer 101 as is the case with Example 1. Then, a first mask pattern 103 is formed over the first conductive layer 102 by a photolithography process. And then, a second conductive layer 302 is formed by etching the first conductive layer 102 under the first condition. In this example, a first etching is carried out under the first condition, that is, an ICP etching method is used, $BCl_3$ and $Cl_2$ are used as an etching gas at a gas flow ratio of 60:20 (sccm), plasma is produced by applying RF (13.56 MHz) power of 450 W at pressure of 1.9 Pa to a coiled electrode, RF (13.56 MHz) power of 100 W is applied to the substrate side (lower electrode), and substantial negative bias power is applied to produce self bias voltage. At this time, a part of the first conductive layer 102 is etched to form a second conductive layer 302 having a taper portion. As a result, as illustrated in FIG. 5B, the second conductive layer 302 is formed having a taper portion at a lower edge of the first mask pattern 103.

As illustrated in FIG. 5B, a first oxide layer 303 is formed by oxidizing the second conductive layer 302. In this instance, pure water is coated by a spin coating method on the surface of the second conductive layer to be oxidized as is the case with Example 3. As a result, particles over the substrate can be washed away.

Then, as illustrated in FIG. 5D, the second conductive layer 302 is etched under the first conditions, and a third conductive layer 311 having a taper portion is formed. Different from the first and the second conductive layers 102 and 302, the third conductive layer 311 is formed as an isolated film pattern having a desired shape over the substrate. Further, a second mask pattern 312 is slightly etched. The mask pattern is referred as a third mask pattern 313.

The third mask pattern 313 is recessed under a second condition to form a fourth mask pattern 322, simultaneously, the upper edge of the third conductive layer 311 is etched to form a fourth conductive layer 321. In this example, the second condition in Example 1 is used as the second condition in this example. That is, $CF_4$ is used as an etching gas as in the case with Example 1. Accordingly, the third mask pattern 313 can be recessed as illustrated in FIG. 5E. As a result, the surface of the upper portion of the third conductive layer 311 is exposed. The exposed portion is gradually etched to form a fourth conductive layer 321 having different inclined planes. At this time, a part of the exposed insulating layer 101 is also etched to form a second insulating layer 133 having difference in level. The thickness of the region of the second insulating layer 133 that is not overlapped with the fourth conductive layer 321 is slightly reduced than that of the insulating layer 133 that is overlapped with the fourth conductive layer 321.

Figure 11A:
FIGS. 11A and 11B are cross-sectional views for showing a shape of a wiring over a substrate according to the present invention.
Figure 11B:
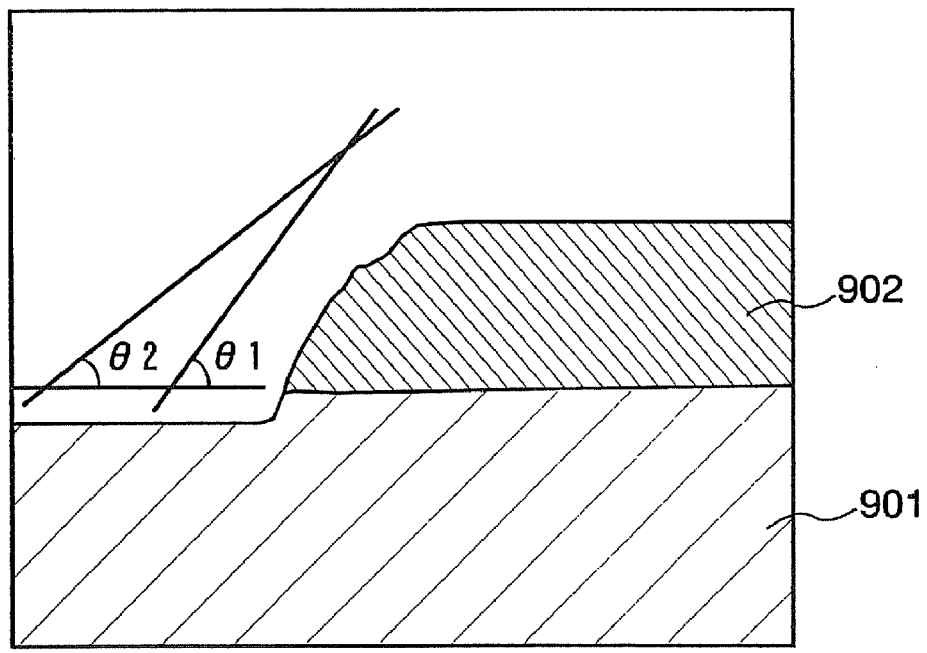

Then, a wiring over the substrate 100 having the fourth conductive layer 321 can be manufactured by removing the fourth mask pattern 322 by stripper. FIGS. 11A and 11B illustrate respectively an SEM view and a schematic view thereof of the fourth mask pattern 321.

FIG. 11A is an SEM view of the cross-section of the third conductive layer, whereas FIG. 11B is a schematic view thereof. A fourth conductive layer 902 is formed on an insulating layer 901. The side of the fourth conductive layer 902 has different inclined planes. A first inclined plane is formed at a lower part of the side of the fourth conductive layer 902. The angle formed by the surface of the insulating layer 901 and a first inclined plane is referred to as $\theta 1$. On the other hand, a second inclined plane is formed at an upper part of the side of the fourth conductive layer 902. The angle formed by the insulating layer 901 and the second inclined plane is referred to as $\theta 2$. In this instance, $\theta 1$ is 65°, whereas $\theta 2$ is 40°.

Table 3 lists the angles $\theta 1$ and $\theta 2$ formed by each of the different inclined planes of the conductive layer formed by the etching method as explained in Embodiment 1 and the insulating layer.

TABLE 3

| $\theta 1(°)$ | $\theta 2(°)$ |
|---|---|
| 67 | 49 |
| 65 | 49 |
| 67 | 50 |
| 67 | 47 |
| 61 | 41 |
| 66 | 45 |
| 60 | 38 |
| 59 | 40 |
| 58 | 53 |
| 58 | 47 |
| 62 | 52 |
| 60 | 49 |
| 60 | 44 |
| 65 | 44 |
| 62 | 47 |
| 58 | 45 |
| 55 | 39 |
| 55 | 40 |
| 55 | 40 |
| 54 | 38 |

According to the above processes, the conductive layers having two different inclined planes can be formed.

EXAMPLE 4

In this example, a process of forming a wiring by an etching method explained in Embodiment 4 is explained with reference to FIGS. 6A to 6E, 12A, and 12B. In this example, a first condition and a second condition which are the same as those explained in Example 2 are used. Further, a process for oxidizing the surface of the conductive layer is included in the process.

A first insulating layer 101 is formed over a substrate 100, and a first conductive layer 102 is formed over the first insulating layer 101 as is the case with Example 1. Then, a first mask pattern 103 is formed on the first conductive layer 102 by a photolithography process. And then, a second conductive layer 211 is formed by etching the first conductive layer 102 under the first condition.

In this example, a first etching is carried out under a first condition that is also used in Example 2. In this instance, a part of the first conductive layer 102 is anisotropically etched. As a result, as illustrated in FIG. 6B, a second conductive layer 211 is formed to have a shape, a part of a side is perpendicular to a lower edge of the first mask pattern 103. Similar to the second conductive layer 302 in Example 3, the second conductive layer 211 is formed over the substrate, and having a concave shape.

As illustrated in FIG. 6C, a first oxide layer 403 is formed by oxidizing the second conductive layer 211. In this instance, pure water is coated by a spin coating method over the surface of the second conductive layer to be oxidized as is the case with Example 3. As a result, particles over the substrate can be washed away.

The first mask pattern 103 is recessed by a second condition to form a second mask pattern 421, simultaneously; the second conductive layer 211 is etched to form a third conductive layer 431. In this example, the second condition in Example 1 is used as the second condition in this example. That is, $CF_4$ is used as an etching gas as in the case with Example 1. Accordingly, the first mask pattern 103 can be recessed as illustrated in FIG. 6D. As a result, the surface of the upper portion of the second conductive layer 211 is exposed. The exposed portion is gradually etched to form a third conductive layer 431 having different inclined planes. The thickness of the region of the second insulating layer 133 that is not overlapped with the third conductive layer 431 is slightly reduced than that of the second insulating layer 133 that is overlapped with the third conductive layer 431.

Figure 12A:
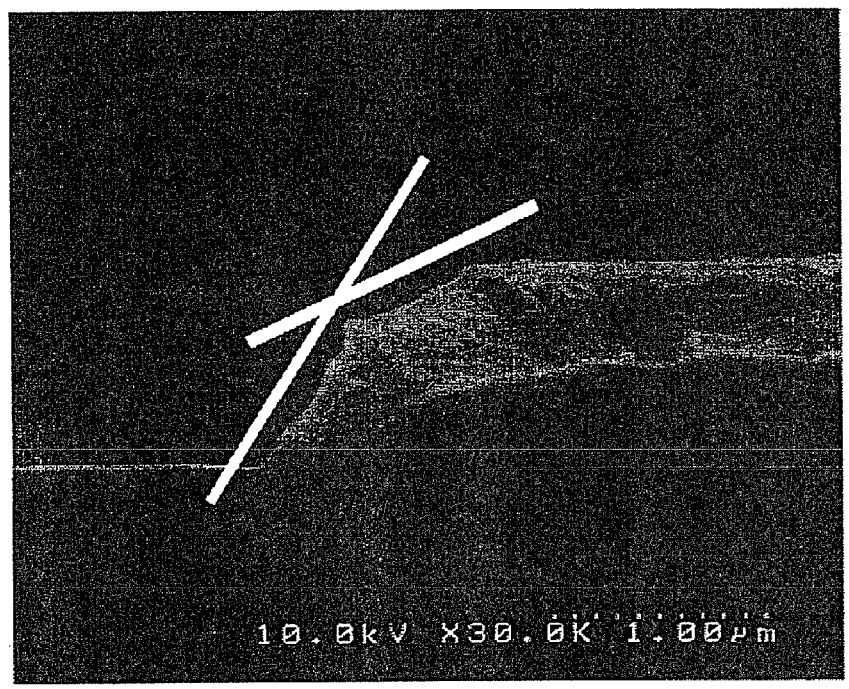
FIGS. 12A and 12B are cross-sectional views for showing a shape of a wiring over a substrate according to the present invention.
Figure 12B:
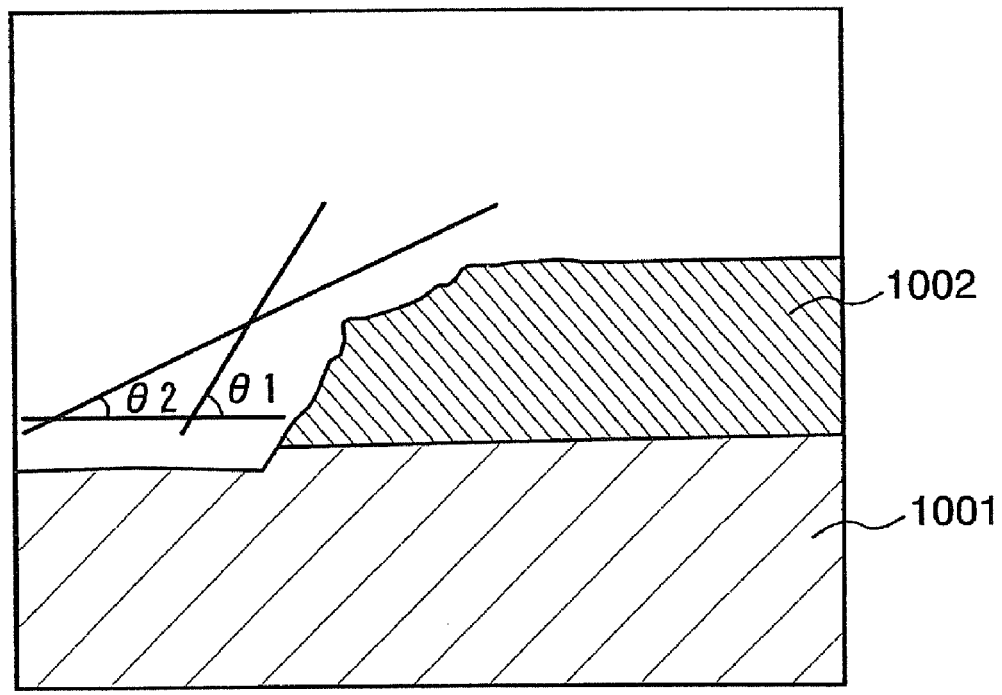

Then, the fourth conductive layer 431 can be manufactured by removing the third mask pattern 421 by stripper. FIGS. 12A and 12B illustrate respectively an SEM view and a schematic view thereof of the fourth conductive layer.

FIG. 12A is an SEM view of the cross-section of the fourth conductive layer, whereas FIG. 12B is a schematic view thereof. A fourth conductive layer 1002 is formed on an insulating layer 1001. The side of the fourth conductive layer 1002 has different inclined planes. A first inclined plane is formed at a lower part of the side of the fourth conductive layer 1002. The angle formed by the surface of the insulating layer 1001 and a first inclined plane is referred to as $\theta 1$. On the other hand, a second inclined plane is formed at an upper part of the side of the fourth conductive layer 1002. The angle formed by the insulating layer 1001 and the second inclined plane is referred to as $\theta 2$. In this instance, $\theta 1$ is 60°, whereas $\theta 2$ is 26°.

Table 4 lists the angles $\theta 1$ and $\theta 2$ formed by each of the different inclined planes of the conductive layer formed by the etching method as explained in Embodiment 4 and the insulating layer.

TABLE 4

| $\theta_1(°)$ | $\theta_2(°)$ |
|---|---|
| 58 | 28 |
| 58 | 26 |
| 60 | 27 |
| 56 | 28 |
| 60 | 30 |
| 60 | 28 |
| 56 | 29 |
| 60 | 28 |
| 61 | 27 |
| 62 | 24 |
| 60 | 34 |
| 58 | 31 |
| 60 | 26 |
| 61 | 24 |
| 61 | 21 |
| 63 | 25 |
| 66 | 33 |
| 70 | 33 |
| 64 | 33 |
| 64 | 32 |
| 61 | 23 |
| 56 | 34 |
| 61 | 29 |
| 62 | 26 |

According to the above processes, the conductive layers having two different inclined planes can be formed.

Figure 13A:
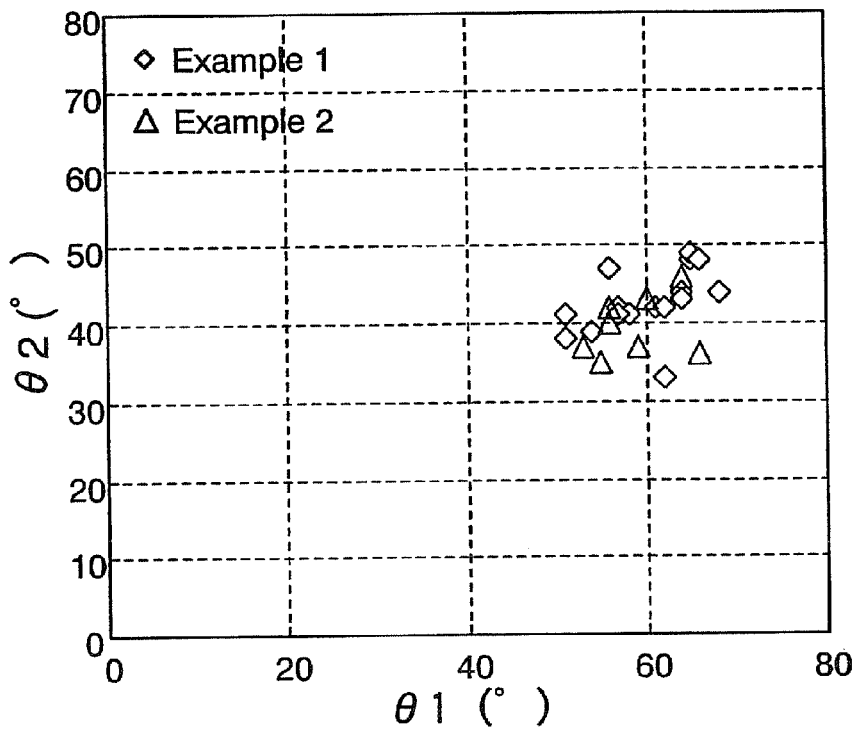
FIGS. 13A and 13B are graphs for showing angles of inclined planes of wirings over substrates according to the present invention.
Figure 13B:
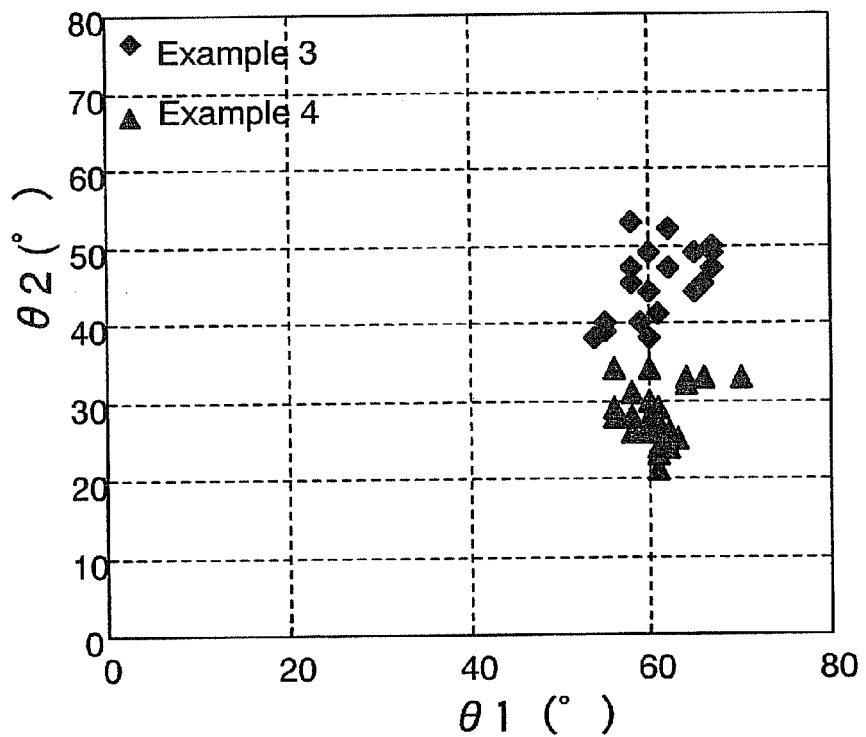

FIGS. 13A and 13B are graphs for showing results from Tables 1 to 4 described in Examples 1 to 4.

Horizontal axes in FIGS. 13A and 13B represent θ1 (angle formed by an inclined plane formed at the lower side of the conductive layer and the surface of the insulating layer), whereas vertical axes represent θ2 (angle formed by an inclined plane formed at the upper side of the conductive layer and the surface of the insulating layer).

FIG. 13A shows θ1 and θ2 of the conductive layers formed according to the process explained in Examples 1 and 2. The angles of θ1 and θ2 of the conductive layers formed according to Example 1 are represented by diamond shapes, whereas the angles of θ1 and θ2 of the conductive layers formed according to Example 2 are represented by triangle shapes. The θ1 of the conductive layer formed according to Example 1 is in a range of 51° to 68°, and 50° to 700°, whereas the θ2 is in a range of 33° to 49°, and 20° to 60°.

The θ1 of the conductive layer formed according to Example 2 is in a range of 53° to 66°, and 50° to 70°, whereas the θ2 is in a range of 35° to 46°, and 20° to 60°.

FIG. 13B shows θ1 and θ2 of the conductive layer formed according to the process explained in Examples 3 and 4. The angles of θ1 and θ2 of the conductive layers formed according to Example 3 are represented by diamond shapes, whereas the angles of θ1 and θ2 of the conductive layers formed according to Example 4 are represented by triangle shapes. The θ1 of the conductive layer formed according to Example 3 is in a range of 54 to 67°, and 50 to 70°, whereas the θ2 is in a range of 38 to 53°, and 20 to 60°.

The θ1 of the conductive layer formed according to Example 4 is in a range of 56° to 70°, and 50° and 70°, whereas the θ2 is in a range of 21° to 34°, and 20° to 60°.

EXAMPLE 5

In this example, a method for manufacturing a light-emitting display panel as a display panel is explained with reference to FIGS. 14A to 16. FIG. 16 illustrate a plane structure of a pixel portion, whereas FIGS. 14A to 15B illustrate schematically a vertical cross-sectional structure of FIG. 16 taken along lines of A-B and C-D. In this example, a fourth conductive layer is formed according to Embodiment 1, but not exclusively, a process according to any one of Embodiments 2 to 4 can also be used.

Figure 14A:
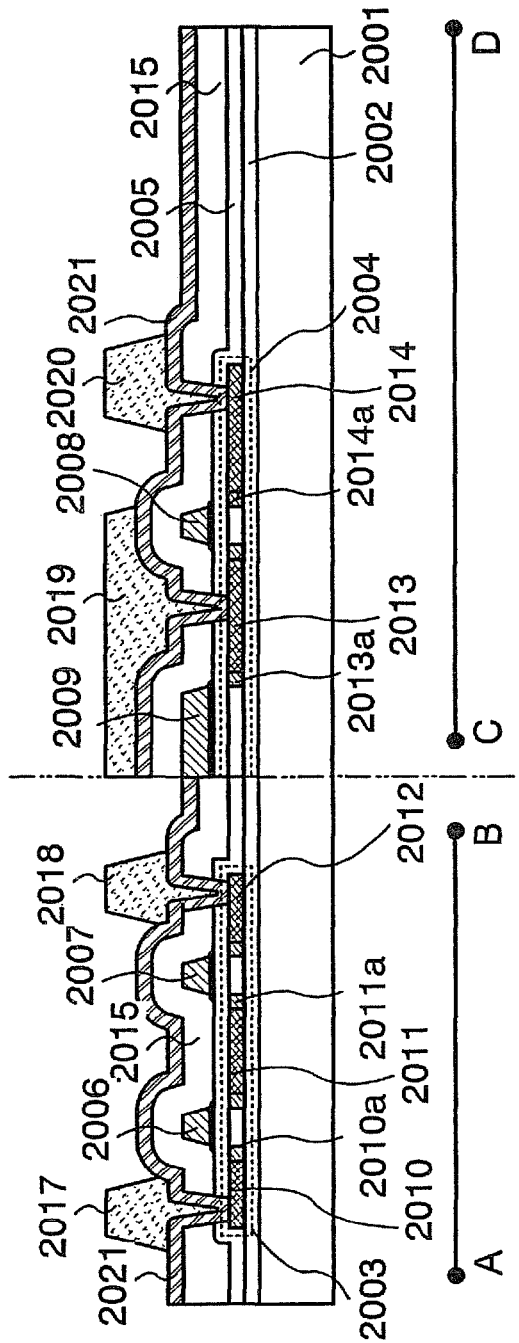
FIGS. 14A and 14B are cross-sectional views for showing a manufacturing process of a semiconductor device according to the present invention.

As illustrated in FIG. 14A, a first insulating layer 2002 is formed to have a thickness of 100 to 1000 nm over a substrate 2001. In this instance, as the first insulating layer 2002, a silicon oxide film with a thickness of 100 nm formed by a plasma CVD method and a silicon oxide film with a thickness of 480 nm formed by a reduced pressure thermal CVD method are stacked.

An amorphous semiconductor film is formed to have a thickness of 10 to 100 nm. In this instance, an amorphous silicon film with a thickness of 50 nm is formed by a reduced thermal pressure CVD method. The amorphous silicon film is crystallized. In this example, a crystalline silicon film is formed by emitting laser light to the amorphous silicon film. Resist is coated over the crystalline silicon film to be pre-baked, and semiconductor regions 2003 and 2004 are formed by removing unnecessary portions of the crystalline silicon film by a first photolithography process and a first etching treatment. A second insulating layer 2005 serving as a gate insulating film is formed. In this instance, a silicon oxide film is deposited by a CVD method as the second insulating layer 2005.

The semiconductor regions 2003 and 2004 may be formed by an organic semiconductor material such as polythienylenevinylene, poly(2,5-thienylenevinylene), polyacetylene, polyacetylene derivatives, or polyarylenvinylene. Further, the second insulating layer 2005 can be formed by solution having an insulating property by using a droplet discharging method, a coating method, a sol-gel method, or the like. As the solution having an insulating property, typically, solution dispersed with fine particles of an inorganic oxide, polyimide, polyamide, polyester, acrylic, PSG (phosphorus glass), BPSG (phosphorus boron glass), silicate SOG (Spin on Glass), polysilazane SOG, alkoxysilicate SOG, siloxane polymer can be appropriately used.

A channel doping process for doping p-type or n-type impurities at a low concentration thoroughly or selectively to a region that is to be a channel region of a TFT is carried out. The channel doping process is a process for controlling threshold voltage of the TFT. In this instance, boron is doped by an ion doping method by which diborane ($B_2H_6$) is not mass-separated but plasma-activated. An ion plantation method that carries out mass separation can be used.

Then, a first conductive layer is formed. In this instance, the first conductive layer is formed by stacking a tantalum nitride (TaN) film and a tungsten (W) film by using a sputtering method. Then, resist is coated over the first conductive layer to be pre-baked. And then, second conductive layers 2006 to 2008 serving as gate electrodes and a second conductive layer 2009 serving as a capacitor wiring are formed by a second photolithography process and a second etching processing.

The second conductive layers 2006 to 2009 can be formed by using a conductor such as Ag or Au by a droplet discharging method, a printing method, an electroplating method, or the like. In this case, the number of processes can be reduced since the second conductive layers can be formed without performing the photolithography processing.

Then, low doped drain regions 2010a, 2011a, 2013a, and 2014a, and high doped drain regions 2010 to 2014 are formed by doping phosphorous in a self-alignment manner by using the second conductive layers 2006 to 2009 as masks. The phosphorous concentration of the low doped drain regions is adjusted to be $1×10^{16}$ to $5×10^{18}$ atoms/cm$^3$ (typically, $3×10^{17}$ to $3×10^{18}$ atmos/cm$^3$), and the phosphorous concentration of the high doped drain regions is adjusted to be $1×10^{20}$ to $1 \times 10^{21}$ atoms/cm$^3$ (typically, $2 \times 10^{20}$ to $5 \times 10^{20}$ atmos/cm$^3$). Among the semiconductor regions 2003 and 2004, regions that are overlapped with thick parts of the second conductive layers 2006 to 2008 serve as channel formation regions.

A third insulating layer is formed to cover the second conductive layers 2006 to 2009. In this instance, an insulating film containing hydrogen is formed. Thereafter, impurities doped to the semiconductor regions are activated and the semiconductor regions are hydrogenated. As the insulating film containing hydrogen, a silicon nitride oxide film (SiNO film) formed by a plasma CVD method is used.

The third conductive layer can be formed by coating and baking a photosensitive or non-photosensitive organic material (polyimide, acrylic, polyamide, polyimideamide, resist, or benzocyclobutene). Alternatively, the third conductive layer can be formed by coating and baking PSG (phosphorous glass), BPSG (phosphorous boron glass), polysilazane SOG, silicate SOG (Spin on Glass), alkoxy silicate SOG, or siloxane polymer.

Further, the third conductive layer can be formed by stacking a silicon oxide film, a silicon nitride film, a silicon oxynitride film, or a silicon nitride oxide film, each of which is formed by a CVD method. Alternatively, the third conductive layer can be formed by stacking two or more of the foregoing layers.

Then, resist is coated over the third insulating layer to be pre-baked. And then, a fourth insulating layer 2015 having an opening portion is formed by a third photolithography process and a third etching treatment, simultaneously, a part of the semiconductor regions is exposed. Thereafter, a third conductive layer 2021 is formed. The third conductive layer 2021 is formed to have a three layered structure formed sequentially by sputtering a titanium film, an aluminum-silicon alloy film, and a titanium film.

Then, resist is coated over the third conductive layer 2021 to be pre-baked, and first mask patterns 2017 to 2020 are formed by a fourth photolithography process.

The first mask patterns 2017 to 2020 may be formed by discharging organic resin such as polyimide, acrylic, polyamide, or polyimideamide to a predetermined position by a droplet discharging method and baking.

Figure 14B:
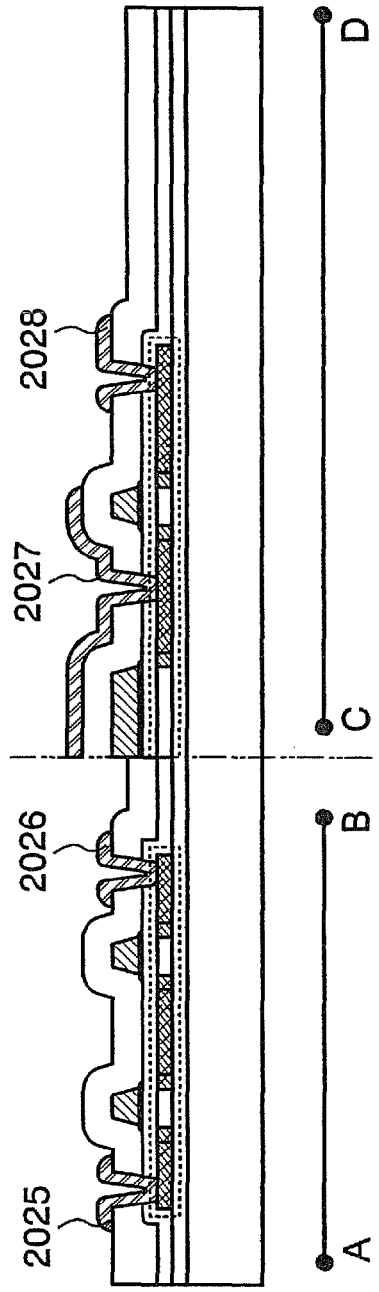

As illustrated in FIG. 14B, the fourth conductive layers 2025 to 2028 are formed by using the first mask patterns 2017 to 2020 by a fourth etching process and a fifth etching process. In this instance, the fourth and fifth etching processes are carried out under the first and second conditions described in Example 1 to form fourth conductive layers 2025 to 2028. Since the side of a fourth conductive layer has a curved surface, cracks in the insulating layer that is formed afterwards can be reduced. By the foregoing processes, a wiring can be formed.

Figure 15A:
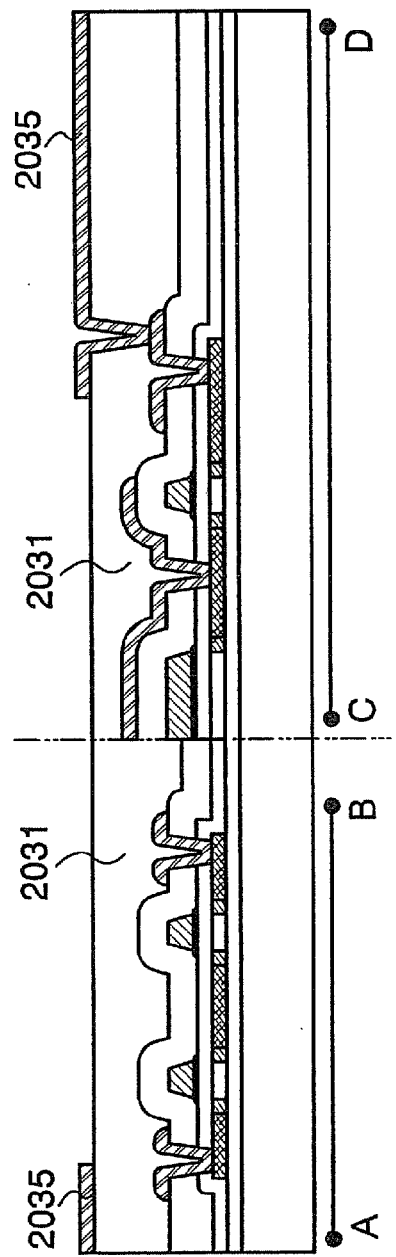
FIGS. 15A and 15B are cross-sectional views for showing a manufacturing process of a semiconductor device according to the present invention.
Figure 16:
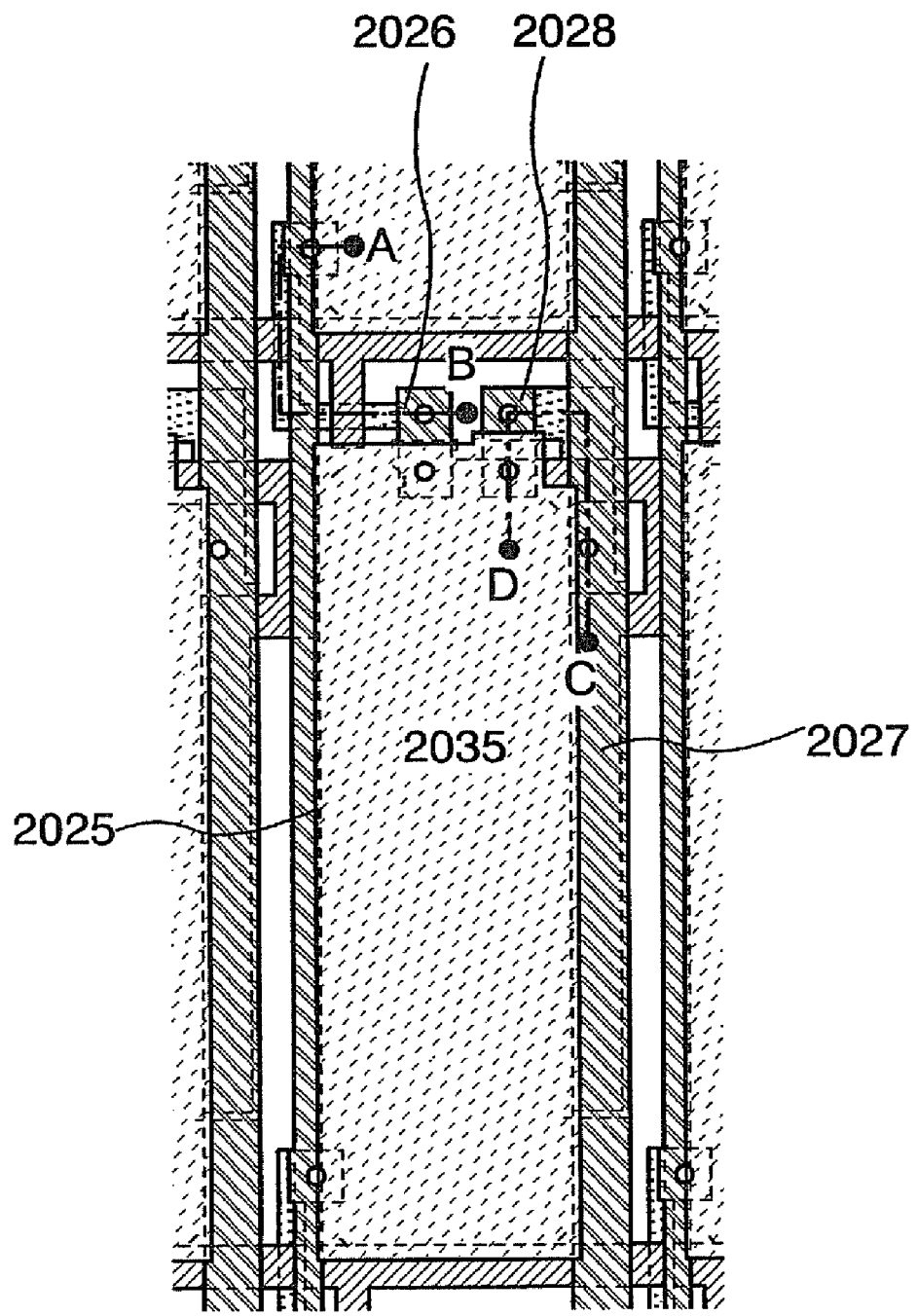
FIG. 16 is a top view for showing a semiconductor device according to the present invention.

As illustrated in FIG. 15A, a fifth insulating layer is formed. The fifth insulating layer is formed by an inorganic insulating layer by a CVD method (silicon oxide, silicon nitride, silicon oxynitride, or the like), a photosensitive or non-photosensitive organic resin layer by a coating method (polyimide, acrylic, polyamide, polyimideamide, resist, or benzocyclobutene), or a laminated layer of the foregoing layers.

As the fifth insulating layer, an insulating layer capable of being planarized is preferably used. As the insulating layer capable of being planarized, the foregoing photosensitive or non-photosensitive organic resin layer formed by a coating method; an insulating layer formed by an SiOx layer by a coating method; or an insulating layer formed by coating and baking inorganic siloxane polymer as typified by silica glass, alkyl siloxane polymer, alkylsilsesquioxane polymer, hydrogenated silsesquioxane polymer, organic siloxane polymer as typified by hydrogenated alkylsilsesquioxane polymer can be used. As an example of the siloxane polymer, PSB-K1 or PSB-K31 that is a coat insulating film material manufactured by Toray Industries, Inc., or ZRS-5PH manufactured by Catalysts & Chemicals Ind. Co., Ltd. can be used. In this instance, the fifth insulating layer is formed by coating and baking acrylic resin. By using an organic material dissolved or dispersed with a material that absorbs visible light such as black pigment or dye as the fifth insulating layer, stray light can be absorbed in a light-emitting element that is formed afterwards, which leads to improve contrast.

Then, resist is coated over the fifth insulating layer to be pre-baked. And then, a sixth insulating layer 2031 having an opening portion by etching the fifth insulating layer by a sixth photolithography process and a sixth etching process, simultaneously, a part of the fourth conductive layer 2028 is exposed.

A fifth conductive layer is formed, and resist is coated over the fifth conductive layer to be pre-baked. Then, a sixth conductive layer 2035 is formed by a seventh photolithography process and a seventh etching process. The sixth conductive layer 2035 serves as a first pixel electrode. As the fifth conductive layer, a reflective conductive film and a transparent conductive film are stacked. In this instance, an alloy film of carbon, nickel, and aluminum; and ITO containing silicon oxide are stacked by a sputtering method. Also refer to FIG. 16 that illustrates a plane structure of FIG. 15A taken along lines of A-B and C-D.

Figure 15B:
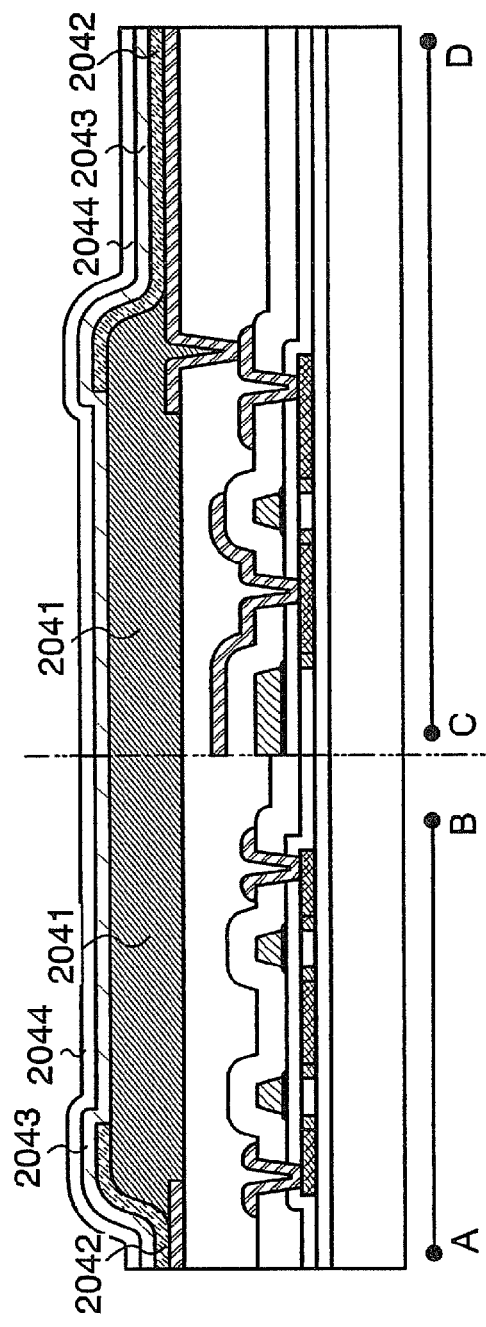

As illustrated in FIG. 15B, a seventh insulating layer 2041 that covers the edge of the sixth conductive layer 2035 to serve as a bank and a black matrix is formed. The seventh insulating layer is an insulator having a light-shielding property and is formed by a photosensitive or non-photosensitive organic material dissolved or dispersed with a material that absorbs visible light such as black pigment or dye (polyimide, acrylic, polyamide, polyimideamide, resist, or benzocyclobutene), or an SOG film (for example, an SiOx film including an alkyl group) to have a thickness of 0.8 to 1 µm. For instance, COLOR MOSAIC CK (product name) manufactured by FUJIFILM Electronics Materials Co., Ltd. is used. By forming the sixth insulating layer 2031 by an insulator having a light-shielding property, an effect of light shielding can also be obtained from the sixth insulating layer 2031 in addition to the seventh insulating layer 2041. The seventh insulating layer 2041 is preferably formed by a photosensitive material since the side of the seventh insulating layer 2041 can be formed to have a radius of curvature that varies continuously and a thin film over the seventh insulating layer 2041 can be formed without step cut.

The seventh insulating layer 2041 can be formed by a droplet discharging method or a printing method.

Then, a layer containing a light-emitting substance 2042 is formed by coating a light-emitting material by a vapor deposition method, a coating method, a droplet discharging method, or the like and to be baked over the sixth conductive layer 2035 and over the edge of the seventh insulating layer 2041. Thereafter, a seventh conductive layer 2043 serving as a second pixel electrode is formed over the layer containing the light-emitting substance 2042. In this instance, ITO containing silicon oxide is deposited by a sputtering method. As a result, a light-emitting element can be formed by the sixth conductive layer, the layer containing a light-emitting substance, and the seventh conductive layer. Each material of the conductive layers and the layer containing a light-emitting substance for constructing the light-emitting element is appropriately selected. Further, the thicknesses of each of the layers are adjusted.

Before forming the layer containing a light-emitting substance 2042, moisture in the seventh insulating layer 2041 or adsorbed to the surface thereof is removed by heat treatment at 200° C. in the atmosphere. Further, it is preferable that heat treatment is performed at 200 to 400° C., preferably, 250 to 350° C. in reduced pressure and the layer containing a light-emitting substance 2042 is formed by a vacuum vapor deposition method or a droplet discharge method in reduced pressure.

The layer containing a light-emitting substance 2042 may be formed by a charge injecting-transporting material containing an organic compound or an inorganic compound and a light-emitting material; may include one or a plurality kinds of layers selected from a low molecular organic compound, an intermediate molecular organic compound as typified by dendrimer, oligomer, or the like, and a high molecular organic compound; and may be combined with an inorganic compound having an electron injecting-transporting property or a hole injecting-transporting property.

Among charge injecting transporting materials, as a material having an extra-high electron transporting property, for example, a metal complex or the like having a quinoline skeleton or a benzoquinoline skeleton such as tris(8-quinolinolato)aluminum (abbreviated as $Alq_3$), tris(5-methyl-8-quinolinolato)aluminum (abbreviated as $Almq_3$), bis(10-hydroxybenzo[h]-quinolinato)beryllium (abbreviated as $BeBq_2$), bis(2-methyl-8-quinolinolato)-4-phenylphenolato-aluminum (abbreviated as BAlq).

As a material having a high hole transporting property, for example, aromatic amine (that is, the one having a benzene ring-nitrogen bond) based compounds such as 4,4'-bis[N-(1-naphthyl)-N-phenyl-amino]-biphenyl (abbreviated as α-NPD), 4,4'-bis[N-(3-methylphenyl)-N-phenyl-amino]biphenyl (abbreviated as TPD), 4,4',4"-tris(N,N-diphenyl-amino)-triphenylamine (abbreviated as TDATA), 4,4',4"-tris[N-(3-methylphenyl)-N-phenyl-amino]-triphenylamine (abbreviated as MTDATA).

Among charge injecting transporting substances, as a material having a high electron injecting property, a compound of an alkali metal or an alkali earth metal such as lithium fluoride (LiF), cesium fluoride (CsF), calcium fluoride ($CaF_2$), or the like can be nominated. Besides, a mixture of a material having a high electron transportation property such as $Alq_3$ and an alkali earth metal such as magnesium (Mg).

Among charge injecting transporting substances, as a material having a high hole injecting property, for example, a metal oxide such as molybdenum oxide (MoOx), vanadium oxide (VOx), ruthenium oxide (RuOx), tungsten oxide (WOx), manganese oxide (MnOx), or the like can be nominated. Besides, a phthalocyanine compound such as phthalocyanine (abbreviated $H_2Pc$) or copper phthalocyanine (CuPc) can be nominated.

Light-emitting layers having different emission wavelength bands may be respectively provided to each pixel for color display. Typically, light-emitting layers corresponding to color of R (red), G (green), and B (blue) are formed. In this instance, color purity can be improved and a pixel portion can be prevented from being a mirror surface (reflection) by providing a filter (colored layer) that transmits light in each emission wavelength bands at the light emission side of the pixel. By providing the filter (colored layer), a circularly-polarized light plate or the like that is conventionally required becomes not required, moreover, light can be emitted from the light-emitting layer without loss of light. Moreover, change in hue occurred in the case of viewing obliquely the pixel portion (display screen) can be reduced. There are various light-emitting materials for forming a light-emitting layer. As a low molecular based organic light-emitting material, 4-(dicyanomethylene)-2-methyl-6-[2-(1,1,7,7-tetramethyljulolidine-9-yl)ethenyl]-4H-pyran (abbreviated as DCJT), 9,10-diphenylanthracene (abbreviated as DPA), periflanthene, 2,5-dicyano-1,4-bis[2-(10-methoxy-1,1,7,7-tetramethyljulolidine-9-yl)ethenyl]benzene, N,N'-dimethylquinacridone (abbreviated as DMQd), coumarin 6, coumarin 545T, tris(8-quinolinolato)aluminum (abbreviated as $Alq_3$), 9,9'-bianthryl, 9,10-diphenylanthracene (abbreviated as DPA), 9,10-di(2-naphthyl)anthracene (abbreviated as DNA), or the like can be used. Another material may be used.

A high molecular based organic light-emitting material has higher physical strength than that of a low molecular based organic light-emitting material, and so a light-emitting element can be manufactured to have high durability. A light-emitting element can be comparatively readily manufactured since the light-emitting element can be formed by a coating method. A structure of a light-emitting element using a high molecular based organic light-emitting material is basically same as that of a light-emitting element using a low molecular based organic light-emitting material. The structure is composed of cathode/layer containing a light-emitting substance/anode. However, in the case of forming the layer containing a light-emitting substance by using a high molecular based organic light-emitting material, it is difficult to form a layered structure like in the case of using a low molecular based organic light-emitting material. Most light-emitting structures have two-layered structures. Specifically, the structure is cathode/light-emitting layer/hole transporting layer/anode.

Since emission color is dependent on a material for forming a light-emitting layer. By selecting the material, a light-emitting element that exhibits desired light emission can be formed. As a high molecular based light-emitting material, a polyparaphenylene vinylene based material, a polyparaphenylene based material, polythiophene based material, or a polyfluorene based material can be nominated.

As the polyparaphenylene vinylene based material, a derivative of poly(praraphenylene vinylene) [PPV], poly(2,5-dialkoxy-1,4-phenylene vinylene) [RO-PPV], poly(2-(2'-ethyl-hexoxy)-5-methoxy-1,4-phenylene vinylene) [MEH-PPV], poly(2-dialkoxyphenyl)-1,4-phenylenevinylene] [ROPh-PPV], and the like are nominated. As the polyparaphenylene based material, a derivative of polyparaphenylene [PPP], poly(2,5-dialkoxy-1,4-phenylene) [RO-PPP], poly(2,5-dihexoxy-1,4-phenylene), and the like are nominated. As the polythiophene based material, a derivative of polythiophene [PT], poly(3-alkylthiophene) [PAT], poly(3-hexylthiophene) [PHT], poly(3-cyclohexylthiophene) [PCHT], poly(3-cyclohexyl-4-methylthiophene) [PCMHT], poly(3,4-dicyclohexylthiophene) [PDCHT], poly[3-(4-octylphenyl)-thiophene] [POPT], poly[3-(4-octylphenyl)-2,2-bithiophene] [PTOPT], and the like are nominated. As the polyfluorene based material, a derivative of polyfluorene [PF], poly(9,9-dialkylfluorene) [PDAF], poly(9,9-dioctylfluorene) [PDOF], and the like are nominated.

A hole injecting property from the anode can be improved by interposing a high molecular based organic light-emitting material having a hole transporting property between the anode and a high molecular based organic light-emitting material having a light-emitting property. Generally, the high molecular based organic light-emitting material having a hole transporting property and an acceptor material dissolved in water is coated by spin coating. The high molecular based organic light-emitting material having a hole transporting property is not dissolved in organic solvent, accordingly, the material can be stacked over the organic light-emitting material having a light-emitting property. As the high molecular based organic light-emitting material having a hole transporting property, mixture of PEDOT and camphoric sulfonic acid (CSA) as an acceptor material, mixture of polyaniline [PANI] and polystyrene sulfonic acid [PSS] as an acceptor material, and the like can be nominated.

The light-emitting layer can be formed to exhibit mono emission color or white emission color. In the case of using a white emission material, color display can be realized when a color filter that transmits light at a specified wavelength is provided at the side of light emission of a pixel.

To form a light-emitting layer that exhibits white emission, for example, $Alq_3$, $Alq_3$ partly doped with Nile red (Nile red is a red pigment), p-EtTAZ, TPD (aromatic diamine) are deposited sequentially by a vapor deposition method. In the case that the light-emitting layer is formed by a coating method using a spin coating method, the material is preferably baked by vacuum heating after coating a light-emitting material. For example, poly(ethylene dioxythiophene)/poly(styrene sulfonate) solution (PEDOT/PSS) may be coated over a whole surface and baked, and polyvinylcarbazole (PVK) solution doped with emission center pigments (1,1,4,4-tetraphenyl-1,3-butadiene (abbreviated TPB), 4-dicyanomethylene-2-methyl-6-(p-dimethylamino-styryl)-4H-pyran (DCM1), Nile red, coumarin 6, or the like) serving as a light-emitting layer may be coated over a whole surface and baked.

The light-emitting layer may be formed by a single layer. In this instance, the light-emitting layer may be made from polyvinylcarbazole (PVK) having a hole transporting property dispersed with a 1,3,4-oxadiazole derivative (PBD) having an electron transporting property. Further, white emission can be obtained by dispersing PBD of 30 wt % as an electron transporting agent and dispersing an appropriate amount of four kinds of pigments (TPB, coumarin 6, DCM1, and Nile red). In addition to the light-emitting element that exhibits white emission as explained in the foregoing, a light-emitting element that can exhibit red emission, green emission, or blue emission can be manufactured by selecting approximately a material of a light-emitting layer.

Furthermore, a triplet excited light-emitting material including a metal complex or the like may be used for the light-emitting layer in addition to a singlet excited light-emitting material. For example, among a pixel having a red light-emitting property, a pixel having a green light-emitting property, and a pixel having a blue light-emitting property; the pixel having a red light-emitting property with comparatively short half reduced luminescence time is formed from a triplet excited light-emitting material, and other pixels are formed from a singlet excited light-emitting material. Since the triplet excited light-emitting material has superior luminous efficiency, a light-emitting element requires much less power to obtain the same level of luminance. In other words, a light-emitting element requires a few amount of current in the case of applying the triplet excited light-emitting material to a red pixel, therefore, the reliability can be enhanced. The pixel having red light-emitting properties and the pixel having green light-emitting properties may be formed by a triplet excited light-emitting material and the pixel having blue light-emitting properties may be formed by a singlet excited light-emitting material to reduce the power consumption. The power consumption can be reduced by also forming the green light-emitting element having high human spectral luminous efficacy by a triplet excited light-emitting material. As an example of a triplet excited light-emitting material, a material using a metal complex as a dopant such as a metal complex having platinum that is a third transition series element as a center metal or a metal complex having iridium as a center metal is known. The triplet excited light-emitting material is not limited to these compounds, and it is also possible to use a compound having the above structure and having an element belonging to Groups 8 to 10 of a periodic table as a center metal. The substance mentioned above that forms the layer containing light-emitting substance is just an example, and a light-emitting element can be formed by appropriately stacking each functional layer such as a hole injecting transporting layer, a hole transporting layer, an electron injecting transporting layer, an electron transporting layer, a light-emitting layer, an electron blocking layer, or a hole blocking layer. In addition, a mixed layer or a mixed junction may be formed with the combination of each layer.

The light-emitting element formed by using the material mentioned above is emitted by having bias in the forward direction. A pixel of a display device formed by using the light-emitting element can be driven by a simple matrix system or an active matrix system. In either system, each pixel is emitted by applying forward bias at particular timing; however, the pixel is in non-luminescent state within the specified period. The reliability of the light-emitting element can be enhanced by applying reverse bias during non-luminescent time. The light-emitting element becomes a decline mode when light-emitting intensity is deteriorated under a certain driving condition or when luminance is apparently deteriorated due to the expansion of non-luminescent region in a pixel. However, the deterioration can be delayed and the reliability of a display device can be enhanced by alternating current driving by which forward bias and reverse bias are applied.

Then, a transparent protective film 2044 for covering a light-emitting element to prevent moisture from penetrating into the light-emitting element is formed. As the transparent protective film 2044, a silicon nitride film, a silicon oxide film, a silicon oxynitride film (SiNO film (composition ratio: N>O) or a SiON film (composition ratio: N<O), a thin film including carbon as its main component (for example, a DLC film, CN film)), or the like, each of which is obtained by a sputtering method or a CVD method can be used.

In accordance with the foregoing processes, a light-emitting display panel having a multi-wire structure can be formed. A protective circuit for preventing electrostatic destruction as typified by a diode may be provided between the connecting terminal and the source wiring (gate wiring), or in a pixel portion. In this instance, electrostatic destruction can be prevented by manufacturing the diode in accordance with the same process as that of the foregoing TFT and connecting the gate wiring layer of the pixel portion to the drain wiring layer or the source wiring layer of the diode.

Any one of Embodiments 1 to 4 can be applied to this example. A light-emitting display panel is explained as a display panel, but the display panel is not limited thereto. The present invention can be appropriately applied to an active display panel such as a liquid crystal display panel, a DMD (Digital Micromirror Device), a PDP (Plasma Display Panel), an FED (Field Emission Display), and an electrophoretic display device (electronic paper).

EXAMPLE 6

The mode of a light-emitting element that is applicable to the foregoing examples is explained with reference to FIGS. 17A to 17D.

Figure 17A:
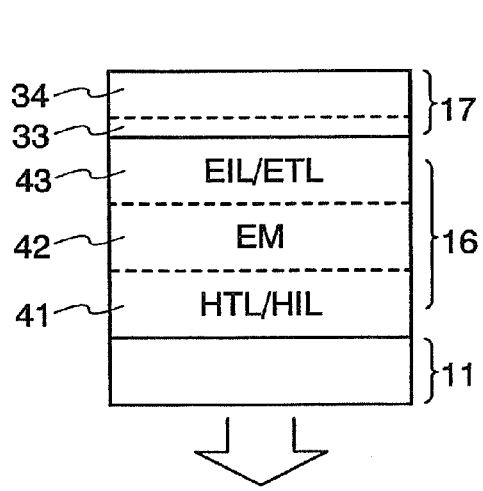
FIGS. 17A to 17F are explanatory views of modes of light-emitting elements that can be applied to the present invention.

FIG. 17A shows an example of forming a first pixel electrode 11 by an oxide conductive material transparent to light, which contains silicon oxide at a concentration of 1 to 15 atom %. A layer containing a light-emitting substance 16 formed by stacking a hole injecting layer or a hole transporting layer 41, a light-emitting layer 42, and electron transporting or injecting layer 43 is provided over the first pixel electrode 11. A second pixel electrode 17 is formed by a third electrode layer 33 containing an alkali metal or an alkali earth metal such as LiF or MgAg, and a fourth electrode layer 34 formed by a metal material such as aluminum. A pixel having the structure can emit light from the side of the first pixel electrode 11 as indicated by arrows in the FIG. 17A.

Figure 17B:
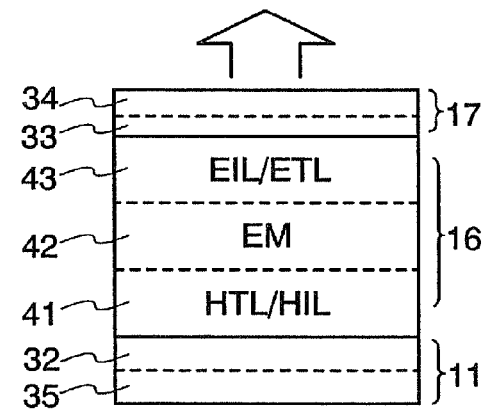

FIG. 17B shows an example of emitting light from the second pixel electrode 17, in which the first pixel electrode 11 is composed of a first electrode layer 35 made from metal such as aluminum or titanium, or a metal material containing the metal and nitrogen at stoichiometric composition ratio or less; and a second electrode layer 32 made from an oxide conductive material containing silicon oxide at a concentration of 1 to 15 atom %. A layer containing a light-emitting substance 16 formed by stacking a hole injecting or hole transporting layer 41, a light-emitting layer 42, and an electron transporting layer or an electron injecting layer 43 is provided over the first pixel electrode 11. The second pixel electrode 17 is formed by a third electrode layer 33 containing an alkali metal or an alkali earth metal such as LiF or CaF, and a fourth electrode layer 34 formed by a metal material such as aluminum. Light can be emitted passing through the second electrode 17 by forming each of the layers to have a thickness of 100 nm or less to be capable of transmitting light.

Figure 17C:
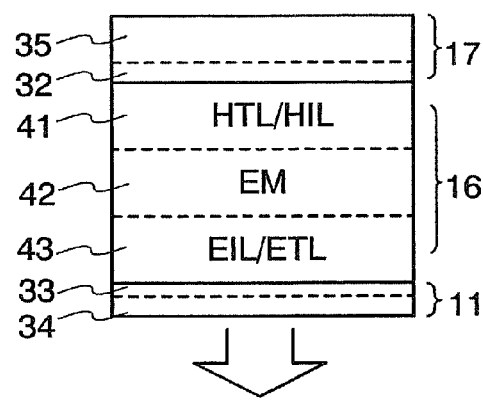
Figure 17D:
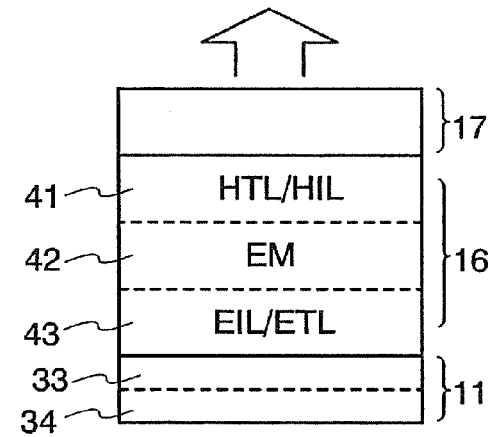
Figure 17E:
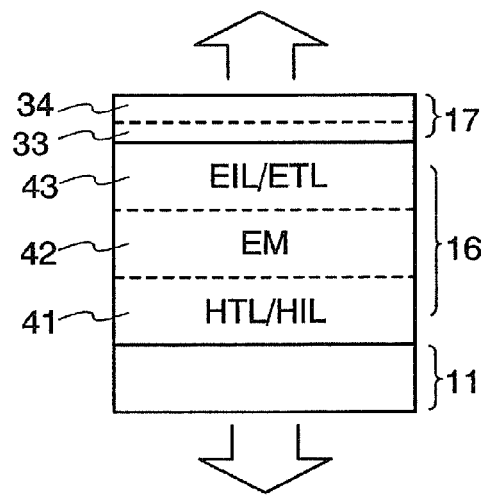

FIG. 17E illustrates an example of emitting light from both directions, that is, the first electrode 11 and the second electrode 17, in which the first pixel electrode 1 is formed by a conductive film having transmittance and a large work function, whereas a second pixel electrode 17 is formed by a conductive film having transmittance and a small work function. Typically, the first pixel electrode 11 is formed by an oxide conductive material containing silicon oxide at a concentration of 1 to 15 atom %, and the second electrode 17 is formed by the third electrode layer 33 containing an alkali metal or an alkali earth metal such as LiF or CaF having a thickness of 100 nm or less, and the fourth electrode layer 34 formed by a metal material such as aluminum having a thickness of 100 nm or less.

FIG. 17C shows an example of emitting light from a first pixel electrode 11, in which a layer containing a light-emitting substance 16 is formed by stacking sequentially an electron transporting or an electron injecting layer 43, a light-emitting layer 42, and a hole injecting or a hole injecting transporting layer 41. A second pixel electrode 17 is formed by sequentially stacking a second electrode layer 32 made from an oxide conductive material containing silicon oxide at a concentration of 1 to 15 atom %; and a first electrode layer 35 made from a metal material such as aluminum or titanium, or a metal material containing the metal and nitrogen at stoichiometric composition ratio or less over the layer containing a light-emitting substance 16. The first pixel electrode 11 is formed by a third electrode layer 33 containing an alkali metal or an alkali earth metal such as LiF or CaF, and a fourth electrode layer 34 formed by a metal material such as aluminum. Light can be emitted passing through the first pixel electrode 11 by forming each of the layers to have a thickness of 100 nm or less to be capable of transmitting light.

FIG. 17D shows an example of emitting light from the second pixel electrode 17, in which a layer containing a light-emitting substance 16 is formed by stacking sequentially an electron transporting layer or an electron injecting layer 43, a light-emitting layer 42, a hole injecting or a hole transporting layer 41. The first pixel electrode 11 is formed to have the same structure as that illustrated in FIG. 17A to have a thickness that can reflect light emitted from the layer containing a light-emitting substance. A second pixel electrode 17 is made from an oxide conductive material containing silicon oxide at a concentration of 1 to 15 atom %. In this structure, the hole injecting or transporting layer 41 is made from a metal oxide that is an inorganic material (typically, molybdenum oxide or vanadium oxide); and so oxygen that is introduced in forming the second electrode layer 32, a hole injecting property is improved, and driver voltage can be lowered.

Figure 17F:
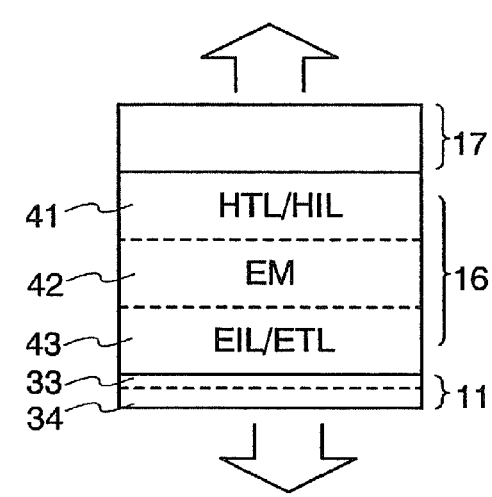

FIG. 17F illustrates an example of emitting light from both directions, that is, the first electrode 11 and the second electrode 17, in which the first pixel electrode 11 is formed by a conductive film having transmittance and a small work function, whereas a second pixel electrode 17 is formed by a conductive film having transmittance and a large work function. Typically, the first pixel electrode 11 may be composed of a third electrode layer 33 containing an alkali metal or an alkali earth metal such as LiF or CaF having a thickness of 100 nm or less, and a fourth electrode layer 34 made from a metal material such as aluminum. The second pixel electrode 17 may be formed by an oxide conductive material containing silicon oxide at a concentration of 1 to 15 atom %.

EXAMPLE 7

A pixel circuit and an operation structure thereof of the light-emitting display panel explained in the foregoing examples are explained with reference to FIGS. 18A to 18F. In a digital display device, the operation structure of the light-emitting display panel can be divided into operation in which a video signal input in a pixel is regulated by voltage and operation in which a video signal input in a pixel is regulated by current. As the operation in which a video signal input in a pixel is regulated by voltage, operation in which voltage that is applied to a light-emitting element constant is constant (CVCV), and operation in which current that is applied to a light-emitting element is constant (CVCC) can be nominated. As the operation in which a video signal input in a pixel is regulated by current, operation in which voltage that is applied to a light-emitting element is constant (CCCV), and operation in which current that is applied to a light-emitting element is constant (CCCC) can be nominated. In this example, pixels of CVCV operation are explained with reference to FIGS. 18A and 18B. Pixels of CVCC operation are explained with reference to FIGS. 18C to 18F.

Figure 18A:
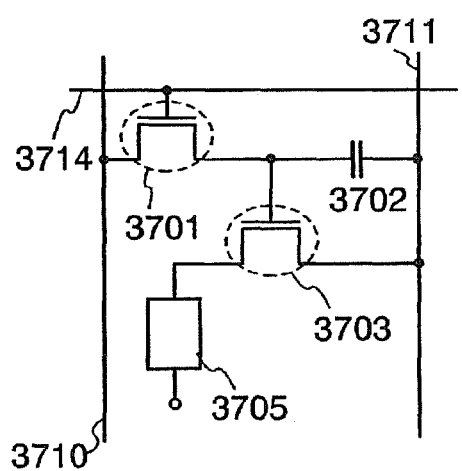
FIGS. 18A to 18F are views for showing equivalent circuits of pixels capable of that can be applied to light-emitting display panels according to the present invention.
Figure 18B:
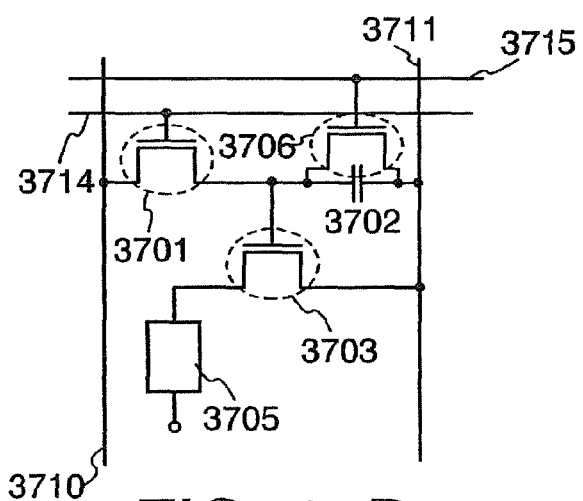

In pixels illustrated in FIGS. 18A and 18B, a signal line 3710 and a power source line 3711 are arranged in column, whereas a signal line 3714 is arranged in rows. The pixels have a switching TFT 3701, a driver TFT 3703, a capacitor 3702, and a light-emitting element 3705.

The switching TFT 3701 and the driver TFT 3703 operate in a linear region when they are ON. The driver TFT 3703 serves to control whether or not applying voltage to the light-emitting element 3705. Both of the TFTs preferably have the same conductivity types in the light of the manufacturing steps. In this example, both of the TFTs are formed to have p-channel TFTs. As the driver TFT 3703, not only an enhancement type but also a depletion type can be used. The ratio of a channel width W of the driver TFT 3703 and a channel length L of the driver TFT 3703 (W/L) are preferably 1 to 1000 though it depends on TFT mobility. The on-current of the TFT is improved with increasing the W/L.

In the pixels illustrated in FIGS. 18A and 18B, the switching TFT 3701 serves to control the input of a video signal to a pixel. Upon turning the TFT 3701 into ON, a video signal is input to the pixel. Then, the voltage of the video signal is stored in a capacitor 3702.

In the case that the power source line 3711 is Vss and an opposing electrode of the light-emitting element 3705 is Vdd in FIG. 18A, that is, in the case of FIGS. 17C, 17D and 17F, the opposing electrode of the light-emitting element is an anode, and the electrode connected to the driver TFT 3703 is a cathode. In this instance, it is possible to suppress luminance irregularity due to dispersion of characteristics of the driver TFT 3703.

In the case that the power source line 3711 is Vdd and an opposing electrode of the light-emitting element 3705 is Vss in FIG. 18A, that is, in the case of FIGS. 17A, 17B and 17E, the opposing electrode of the light-emitting element is a cathode, and the electrode connected to the driver TFT 3703 is an anode. In this instance, a video signal having higher voltage than that of the Vdd is input to the signal line 3710, and so voltage of the video signal is stored in the capacitor 3702 and the driver TFT 3701 operates in a linear region. Accordingly, luminance irregularity due to dispersion characteristics of the TFT can be improved.

The pixel illustrated in FIG. 18B has the same pixel structure as that illustrated in FIG. 18A except the point of adding a TFT 3706 and a scanning line 3715.

The ON/OFF of the TFT 3706 is controlled by the scanning line 3715 that is newly provided. Upon turning the TFT 3706 into ON, charges stored in the capacitor 3702 are discharged and the TFT 3703 is turned into OFF. That is, the state in which current is forced to stop flowing in the light-emitting element 3705 can be made depending on the arrangement of the TFT 3706. Accordingly, the TFT 3706 can be referred to as an erasing TFT. Therefore, the structure illustrated in FIG. 18B can start a lighting period simultaneously with or immediately after the start of a writing period without waiting writing of a signal to all pixels. As a result, duty ratio of light emission can be improved.

In a pixel having the foregoing structure, the current value of the light-emitting element 3705 can be determined by the driver TFT 3703 that operates in a linear region. According to the foregoing structure, dispersion of TFT characteristics can be suppressed. Accordingly, a display device with improved image quality can be provided by improving luminance irregularity of the light-emitting element due to dispersion of TFT characteristics.

Then, pixels of CVCC operation are explained with reference to FIGS. 18C to 18F. The pixel illustrated in FIG. 18C is formed by providing a power source line 3712 and a current control TFT 3704 to the pixel structure illustrated in FIG. 18A.

Figure 18C:
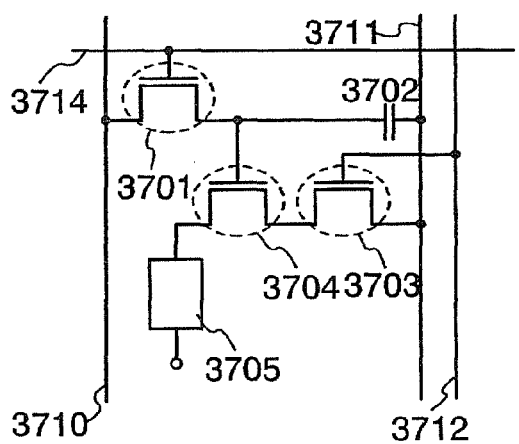
Figure 18D:
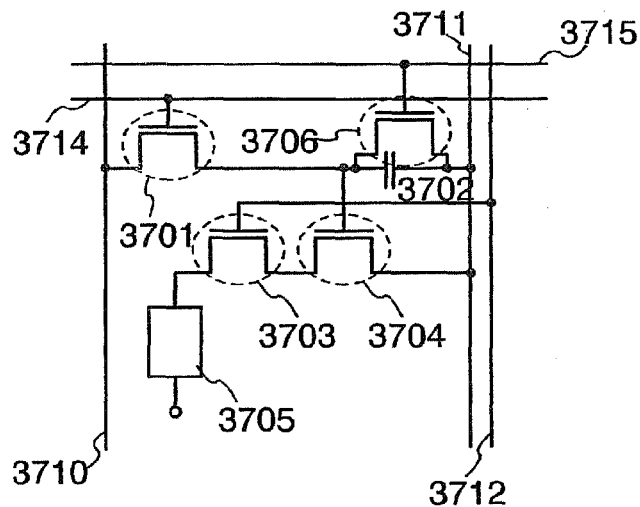
Figure 18E:
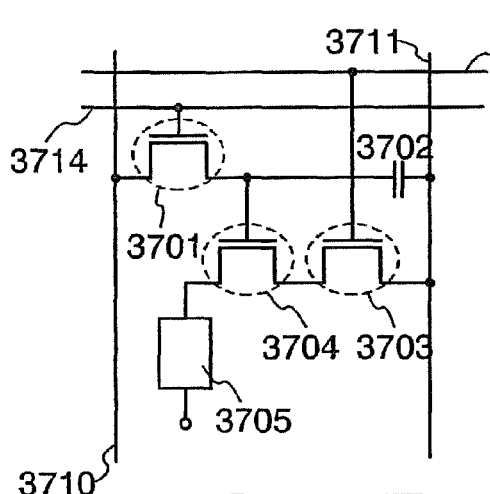

The pixel illustrated in FIG. 18E has the same structure as that illustrated in FIG. 18C except the point that the gate electrode of the driver TFT 3703 is connected to the power source line 3712, which is arranged in rows. That is, both of the pixels illustrated in FIGS. 18C and 18E have the same equivalent circuits. However, each power source line is formed by conductive films of different layers in the case of arranging a power source line 3712 in column (FIG. 18C) and in the case of arranging a power source line 3712 in rows (FIG. 18E). Here, attention is attracted to a wiring connected with the gate electrode of the driver TFT 3703. In order to show that these wirings are formed by different layers, the pixels are illustrated by using two diagrams, FIGS. 18C and 18E.

The switching TFT 3701 operates in a linear region, whereas the driver TFT 3703 operates in a saturation region. Further, the driver TFT 3703 serves to control the value of current flowing through the light-emitting element 3705, whereas the TFT 3704 operates in the saturation region and serves to control the supply of current to the light-emitting element 3705.

Figure 18F:
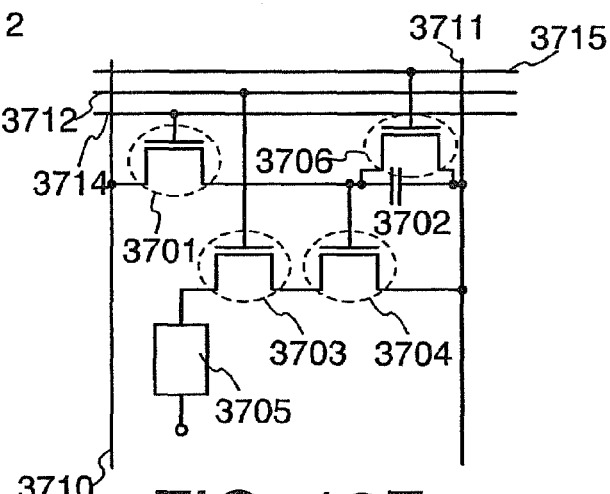

The pixels illustrated in FIGS. 18D and 18F have the same pixel structures as that illustrated in FIGS. 18C and 18E except the point that the erasing TFT 3706 and the scanning line 3715 are added to the pixels illustrated in FIGS. 18C and 18E.

The pixels illustrated in FIGS. 18A and 18B can operate CVCC. The pixels having operation structures illustrated in FIGS. 18C to 18E can appropriately change Vdd and Vss depending on the direction of current flow of the light-emitting element like FIGS. 18A and 18B.

In the pixel having the foregoing structure, a slight change of a voltage between a gate electrode and a source region (Vgs) of the TFT 3704 does not affect the current value of the light-emitting element 3705 since the TFT 3704 operates in a linear region. That is, the current value of the light-emitting element 3705 can be determined depending on the driver TFT 3703 operating in a saturation region. According to the foregoing structure, a display device with an improved image quality can be provided by improving luminance irregularity of the light-emitting element due to dispersion of TFT characteristics.

Especially in the case of forming a thin film transistor having an amorphous semiconductor or the like, it is preferably to increase the semiconductor film area of the driver TFT since dispersion of the TFT can be reduced. Therefore, the pixels illustrated in FIGS. 18A and 18B can increase aperture ratio since they have the small number of TFT.

The structure in which the capacitor 3702 is provided is explained. The present invention is not limited thereto. The capacitor 3702 is not always provided if gate capacitance can serve as retention volume for a video signal.

In the case that the semiconductor region of the thin film transistor is formed by an amorphous semiconductor film, a circuit for correcting a threshold value in a pixel or the periphery of the pixel is preferably formed since the threshold value tends to shift.

It is considered that such the active matrix light-emitting device has advantage to drive at low voltage since TFTs are provided to each pixel in the case of increasing pixel density. At the same time, a passive matrix light-emitting device in which TFTs are provided to row-by-row can be formed. The passive matrix light-emitting device has high aperture ratio since TFTs are not provided to each pixel.

In the display device according to the present invention, the driving method of screen display is not especially limited, for example, a dot sequential driving method, a line sequential driving method, or a plane sequential driving method may be used. Typically, a line sequential driving method is used and a time-division gradation driving method or an area gradation driving method may be appropriately used. A video signal input to the source line of a display device may be either an analog signal or a digital signal. A driver circuit and the like may be appropriately designed in accordance with the video signal.

As noted above, various pixel circuits can be adopted.

EXAMPLE 8

In this example, as an example of a display module, an external view of a light-emitting display module is explained with reference to FIGS. 19A and 19B. FIG. 19A is a top view of a panel in which a first substrate 1200 and a second substrate 1204 are sealed with a first sealant 1205 and a second sealant, whereas FIG. 19B is a cross-sectional view of FIG. 19A taken along line of A-A'.

In FIG. 19A, reference numeral 1201 represented by dotted line denotes a signal line (source line) driver circuit; 1202, a pixel portion; and 1203, a scanning line (gate line) driver circuit. In this example, the signal line driver circuit 1201, the pixel portion 1202, and the scanning line driver circuit 1203 present within the region that is sealed with the first sealant 1205 and the second sealant. As the first sealant 1205, epoxy resin having high viscosity including filler is preferably used. As the second sealant, epoxy resin having low viscosity is preferably used. Further, the first sealant 1205 and the second sealant preferably do not penetrate moisture or oxygen as much as possible.

Drying agent may be provided between the pixel portion 1202 and the first sealant 1205. Further, the drying agent may be provided over the scanning line and the signal line in the pixel portion. As the drying agent, a substance that adsorbs water ($H_2O$) by chemical adsorption, for example, oxides of an alkaline earth metal such as calcium oxide (CaO) or barium oxide (BaO) is preferably used. Alternatively, a substance that adsorbs water by physical adsorption such as zeolite or silica gel can also be used.

The drying agent can be fixed to the second substrate 1204 in the state of being contained as a granular substance in resin having high moisture permeability. The following can be given as an example of the resin having high moisture permeability: acrylic resin such as ester acrylate, ether acrylate, ester urethane acrylate, ether urethane acrylate, butadiene urethane acrylate, special urethane acrylate, epoxy acrylate, amino resin acrylate or acrylic resin acrylate. In addition, epoxy resin such as bisphenol A type liquid resin, bisphenol A type solid resin, resin containing bromo-epoxy, bisphenol F type resin, bisphenol AD type resin, phenol type resin, cresol type resin, novolac type resin, cyclic aliphatic epoxy resin, epi-bis type epoxy resin, glycidyl ester resin, glycidyl amine resin, heterocyclic epoxy resin, or modified epoxy resin can be used. Alternatively, other substances may be used. For example, an inorganic substance such as siloxane polymer may be used.

By providing the drying agent to the region that is overlapped with the scanning line, moisture penetrating into the display element and deteriorations due to the moisture can be prevented without reducing an opening ratio.

Reference numeral 1210 denotes a connecting region for transmitting a signal that is input to the signal line driver circuit 1201 and the scanning line driver circuit 1203. The connecting regions 1210 receives a video signal or a clock signal from an FPC (flexible printed circuit) 1209 serving as an external input terminal via a connecting wiring 1208.

The cross-sectional structure is explained with reference to FIG. 19B. The pixel portion 1202 and the driver circuit are formed over the first substrate 1200. The first substrate 1200 has a plurality of semiconductor elements as typified by a TFT. As the driver circuit, the signal driver circuit 1201 is represented. A CMOS circuit that combines an n-channel TFT 1221 and a p-channel TFT 1222 is formed in the signal line driver circuit 1201.

In this example, a signal line driver circuit 1201, a scanning line driver circuit 1203, and a pixel portion 1202 are formed over one substrate. Accordingly, the capacity of a light-emitting display device can be reduced.

The pixel portion 1202 includes a switching TFT 1211, a driver TFT 1212, and a first pixel electrode 1213 formed by a conductive film having reflectivity connected electrically to the drain of the driver TFT 1212.

An interlayer insulating film 1220 of the TFTs 1211, 1212, 1221, and 1222 can be formed by a material containing an inorganic material (silicon oxide, silicon nitride, silicon oxynitride), organic material (polyimide, polyamide, polyimideamide, benzocyclobutene, siloxane polymer) as its main component. In the case of using siloxane polymer as a raw material of the interlayer insulating film, the interlayer insulating film is formed to be an insulating film, which has a skeleton structure including silicon and oxygen, and which has hydrogen and/or an alkyl group as a side-chain.

An insulator 1214 (also referred to as a bank) is formed at the edge of the first pixel electrode 1213. In order to improve the coverage of a film formed over the insulator 1214, the insulator 1214 is formed to have a curvature in its upper edge or lower edge. As a material for the insulator 1214, a material containing an inorganic material (silicon oxide, silicon nitride, or silicon oxynitride), organic material (polyimide, polyamide, polyimideamide, benzocyclobutene, or siloxane polymer) as its main component is used. In the case of using siloxane polymer as a raw material of the insulator, the insulator is formed to be an insulating film, which has a skeleton structure including silicon and oxygen, and which has hydrogen and/or an alkyl group as a side-chain. Further, the insulator 1214 may be covered by an aluminum nitride film, an aluminum nitride oxide film, a thin film containing carbon as its main component, or a protective film formed by a silicon nitride film. By using an organic material dissolved or dispersed with a material that absorbs visible light such as a black pigment or dye for the insulator, it is possible that a light-emitting element in which stray light can be absorbed and contrast can be improved can be formed afterwards.

An organic compound material is deposited over the first pixel electrode 1213 to form selectively a layer containing a light-emitting substance 1215.

The layer containing the light-emitting substance 1215 can use appropriately the structure described in Example 5.

Accordingly, a light-emitting element 1217 composed of the first pixel electrode 1213 the layer containing a light-emitting substance 1215, and the second pixel electrode 1216 is formed. The light-emitting element 1217 emits light to the side of the second substrate 1204.

A protective laminated layer 1218 for sealing the light-emitting element 1217 is formed. The protective laminated layer 1218 is formed by a laminated layer composed of a first inorganic insulating film, a stress relieving film, and a second inorganic insulating film. The protective laminated layer 1218 is adhered to the second substrate 1204 by the first sealant 1205 and the second sealant 1206. A polarized plate 1225 is fixed to the second substrate 1204, and a retardation plate 1229 of $\frac{1}{2}\lambda$ or $\frac{1}{4}\lambda$ and an antireflection film 1226 are formed over the surface of the polarized plate 1225. Alternatively, the retardation plate 1229 of $\frac{1}{2}\lambda$ or $\frac{1}{4}\lambda$ may be formed over the second substrate 1204, and the polarized plate 1225 may be formed over the retardation plate 1229.

The connecting wiring 1208 is electrically connected to an FPC 1209 by an anisotropic conductive film or an anisotropic conductive resin 1227. Moreover, a connecting portion of each of the wiring layers and each of the connecting terminals are preferably sealed by sealing resin. By this structure, moisture from the cross-section can be prevented from penetrating into the light-emitting element to prevent deterioration of the light-emitting element.

The second substrate 1204 and the protective laminated layer 1218 can have space therebetween filled with an inert gas, for example, a nitride gas. Accordingly, moisture and oxygen can be further prevented.

A coloring layer can be provided over the surface of the second substrate 1204 or between the second substrate 1204 and the polarized plate 1225. In this instance, full color display can be realized by providing a light-emitting element capable of exhibiting white light emission to the pixel portion and by providing a coloring layer exhibiting RGB over the second substrate 1204 or between the second substrate 1204 and the polarized plate 1225. Alternatively, full color display can be realized by providing a light-emitting element capable of exhibiting blue emission and separately providing a color conversion layer. Moreover, each of a pixel portion and a light-emitting element exhibiting red, green, and blue emission are formed, and a coloring layer can be used over the second substrate 1204 or between the second substrate 1204 and the polarized plate 1225. Such a display module can have high color purity of each RGB and display high-resolution images.

A light-emitting display module can be formed by using a substrate such as a film or resin as either or both of the first substrate 1200 or the second substrate 1204. By sealing the light-emitting element without using an opposing substrate as noted above, a display device can be further reduced its weight, size, and thickness.

Any one of Embodiments 1 to 4 can be applied to this example. A light-emitting display module is explained as a display module, but the display module is not limited thereto. The present invention can be appropriately applied to a display module such as a liquid crystal display module, a DMD (Digital Micromirror Device), a PDP (Plasma Display Panel), an FED (Field Emission Display), and an electrophoretic display device (electronic paper).

EXAMPLE 9

In this example, a method for manufacturing a semiconductor device having a laminated wirings structure is explained with reference to FIG. 24.

Figure 24:
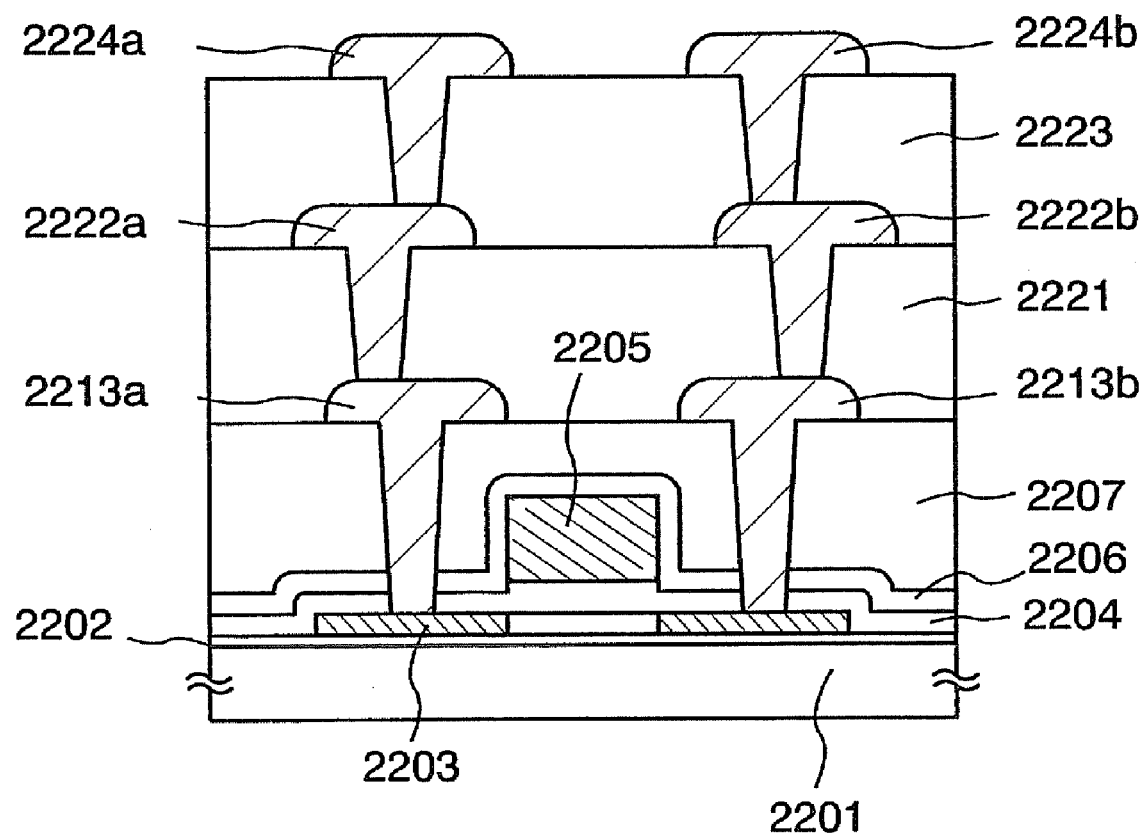
FIG. 24 is a cross-sectional view for showing a semiconductor device according to the present invention.

As illustrated in FIG. 24, a base film 2202 is formed to block impurities from a substrate 2201 is formed over a substrate 2201. Thereafter, a semiconductor region formed by a semiconductor layer having a desired shape is formed, and a first insulating layer 2204 serving as a gate insulating film and a first conductive layer serving as a gate electrode are deposited. Then, the first conductive layer is etched into a desired shape to form a gate electrode 2205. In this instance, a part of the first insulating layer 2204 is etched depending on etching conditions, which leads to reduce a thickness of the first insulating layer 2204. Then, a second insulating layer 2206 may be formed by a silicon oxide film all over the substrate. By the second insulating layer, oxidization of the gate electrode can be prevented. And then, impurities are doped to the semiconductor region by using the gate electrode as a mask to form an impurity region, and heat treatment, strong light irradiation, or laser light irradiation is carried out in order to activate impurities doped to the impurity region. By this process, a source region and a drain region 2203 are formed. Thereafter, a first interlayer insulating layer 2207 is formed by coating organic resin over the first insulating layer 2206.

An opening portion is formed by etching a part of the first interlayer insulating layer 2207, simultaneously, a part of the source region and the drain region 2203 is exposed. Then, a second conductive layer is formed. And then, a source electrode and a drain electrode 2213*a* and 2213*b* are formed by using the first conditions and the second conditions described in Embodiment 1. The side faces of the source electrode and the drain electrode 2213*a* and 2213*b* are formed to have a curved surface.

Organic resin is coated over the first interlayer insulating layer 2207 and the source electrode and the drain electrode 2213*a* and 2213*b* and hardened to form a second interlayer insulating layer 2221. Then, a part of the second interlayer insulating layer 2221 is etched to expose a part of the source electrode and the drain electrode 2213*a* and 2213*b*. And then, a third conductive layer is formed all over the substrate to be etched by using the first conditions and the second conditions described in Embodiment 1 to form first wirings 2222*a* and 2222*b* connected to the source electrode and the drain electrode 2213*a* and 2213*b*.

A multi-wire structure can be formed by forming a third interlayer insulating layer 2223 and second wirings 2224*a* and 2224*b*.

EXAMPLE 10

According to the present invention, a semiconductor device such as a highly integrated semiconductor circuit composed of the integration of semiconductor elements, typically, a signal line driver circuit, a controller, a CPU, a converter of a sound processing circuit, a power source circuit, a sending and receiving circuit, a memory, or an amplifier of a sound processing circuit can be formed with high yields and high reliability. Moreover, a system on chip, which can be increased its speed, improved its reliability, and reduced its power consumption, and which is monolithicly mounted with a circuit constituting a system such as a memory or I/O interface can be formed with high yields and high reliability.

EXAMPLE 11

Figure 20:
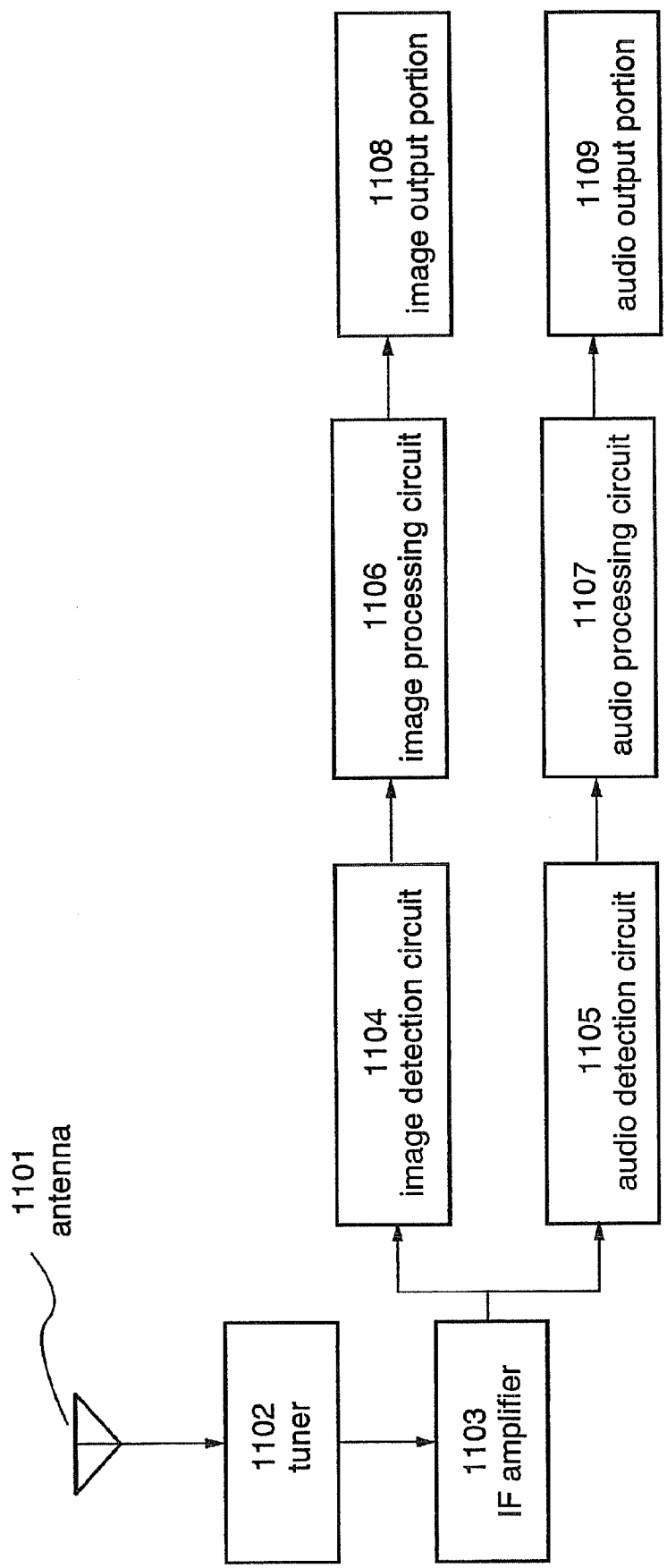
FIG. 20 is a block view for showing a structure of an electronic device.
Figure 21:
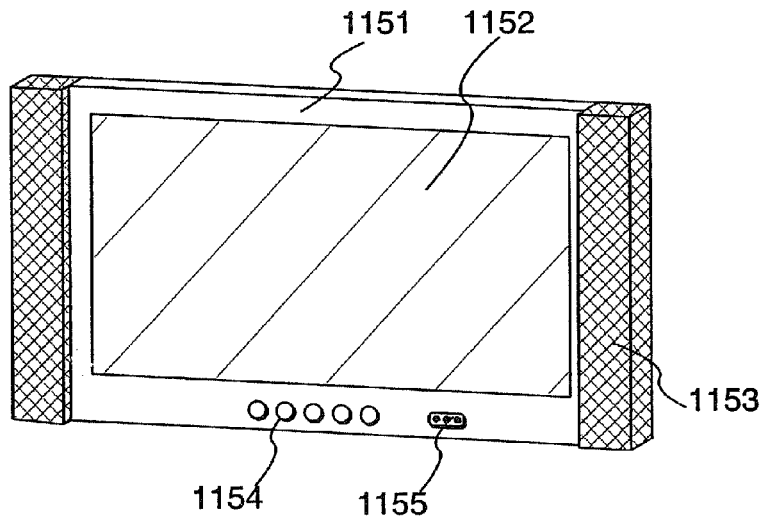
FIG. 21 is an example of an electronic device.
Figure 22A:
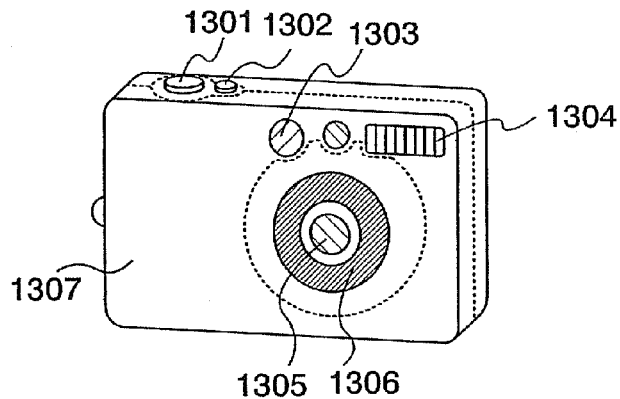
FIGS. 22A and 22B are an example of an electronic device.
Figure 22B:
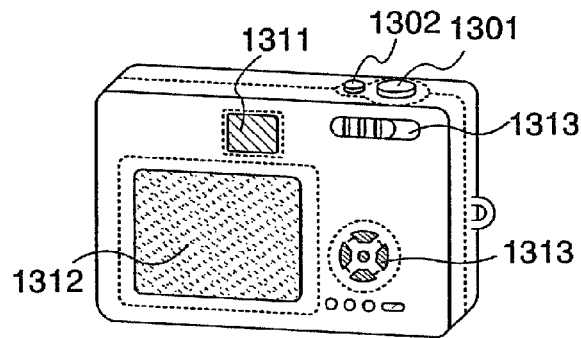

Various electronic devices can be manufactured by incorporating the semiconductor device described in the above examples into a housing. Examples of electronic devices can be given as follows: a television set, a camera such as a video camera or a digital camera, a goggle type display (head mount display), a navigation system, an audio reproducing device (a car audio, an audio component, or the like), a personal computer, a game machine, a personal digital assistant (a mobile computer, a cellular phone, a portable game machine, an electronic book, or the like), an image reproducing device including a recording medium (specifically, a device that can reproduce a recording medium such as a Digital Versatile Disc (DVD) and has a display device that can display the image of the recording medium), or the like. As typical examples of the electronic devices, FIG. 20 and FIG. 21 illustrate the television set and a block diagram thereof, respectively. FIGS. 22A and 22B illustrate a digital camera.

FIG. 20 is a diagram showing a general structure of a television set that receives analog television broadcasting. In FIG. 20, the airwaves for television broadcasting received by an antenna 1101 are input into a tuner 1102. The tuner 1102 generates and outputs intermediate frequency (IF) signals by mixing the high frequency television signals input from the antenna 1101 into locally-oscillating frequency signals that are controlled in accordance with the desired reception frequency.

The IF signals taken out by the tuner 1102 are amplified to the required voltage by an intermediate frequency amplifier (IF amplifier) 1103. Thereafter the amplified IF signals are image detected by an image detection circuit 1104 and audio detected by an audio detection circuit 1105. The image signals output from the image detection circuit 1104 are divided into luminance signals and chrominance signals by an image processing circuit 1106. Further, the luminance signals and the chrominance signals are subjected to the predetermined image signal processing to be image signals, so that the image signals are output to an image output portion 1108 of a display device that is a semiconductor device of the present invention, typically, a liquid crystal display device, a light-emitting display device, a DMD (Digital Micromirror Device), a PDP (Plasma Display Panel), an FED (Field Emission Display), an electrophoretic display device (an electronic paper) or the like. Note that a television that uses the liquid crystal display device as the display device becomes a liquid crystal television, and a television that uses the light-emitting display device as the display device becomes an EL television. The same is true in using another display device.

The signals output from the audio detection circuit 1105 are subjected to processing such as FM demodulation by an audio processing circuit 1107 to be audio signals. The audio signals are then amplified appropriately to be output to an audio output portion 1109 such as a speaker or the like.

The television set according to the invention may be a television that is compatible with not only analog broadcastings such as terrestrial broadcasting in a VHF band or a UHF band, cable broadcasting, and BS broadcasting, but also digital broadcastings such as terrestrial digital broadcasting, cable digital broadcasting, and BS digital broadcasting.

FIG. 21 is a front perspective view of the television set, which includes a housing 1151, a display portion 1152, a speaker portion 1153, an operational portion 1154, a video input terminal 1155, and the like. The television set has a structure illustrated in FIG. 20.

The display portion 1152 is an example of the image output portion 1108 illustrated in FIG. 20. The display portion displays images thereon.

The speaker portion 1153 is an example of the audio output portion 1109 illustrated in FIG. 20. The speaker portion outputs audio therefrom.

The operational portion 1154 is provided with a power source switch, a volume switch, a channel select switch, a tuning switch, a selection switch, and the like to turn ON/OFF the television set, to select images, to control sound, to select a tuner, and the like, respectively, by holding the switches down. Note that the selections as mentioned above can be performed also by a remote-control operation unit, though not shown in the drawing.

The video input terminal 1155 inputs image signals into the television set from an external device such as a VTR, a DVD, or a game machine.

In the case of a wall-mounted television set, a portion for hanging on walls is provided on the rear of the television set that is described in this embodiment.

A television set can be manufactured at low cost with high throughput and high manufacturing yields by applying the display device that is an example of a semiconductor device according to the invention to the display portion of the television set. In addition, a television set can be manufactured at low costs with high throughput and yields by applying a semiconductor device according to the invention to a CPU for controlling an image detection circuit, an image processing circuit, an audio detection circuit, and an audio processing circuit of a television set. Consequently, such the television can be used for various purposes particularly as a large area display medium such as a wall-mounted television set; information display boards in railway stations, airports, or the like; or advertisement display boards on the streets.

FIGS. 22A and 22B illustrate an example of a digital camera. FIG. 22A is a front view of the digital camera, whereas FIG. 22B is a rear view thereof. In FIG. 22A, a digital camera is provided with a release button 1301, a main switch 1302, a viewfinder window 1303, a flash 1304, a lens 1305, a camera cone 1306, and a housing 1307.

In FIG. 22B, the digital camera is provided with a viewfinder eyepiece 1311, a monitor 1312, and an operational button 1313.

When holding down half the release button 1301, a focus adjustment mechanism and an exposure adjustment mechanism are operated. When holding down the release button completely, a shutter is released.

The digital camera is turned ON/OFF by holding down or rotating the main switch 1302.

The viewfinder window 1303 is disposed above the lens 1305 on the front face of the digital camera. The viewfinder window 1303 is used to check a shooting range and a focusing point through the viewfinder eyepiece 1311 that is illustrated in FIG. 22B.

The flash 1304 is disposed at the upper portion of the front face of the digital camera body. When the luminance of an object is low, the release button is held down to emit auxiliary light simultaneously with releasing the shutter.

The lens 1305 is disposed on the front of the digital camera. The lens is composed of a focusing lens, a zoom lens, and the like. The lens constitutes an optical shooting system together with a shutter and an aperture, each of which is not shown. An image sensing device such as a CCD (charge coupled device) is located in the region posterior to the lens.

The camera cone 1306 is used to move the position of the lens in order to bring into focus the focusing lens, the zoom lens, or the like. When taking a picture, the lens 1305 is brought to the fore by bringing the camera cone forward. When carrying the camera, the lens 1305 is stored inside the main body to make the camera be compact. The camera according to this example can take a picture in zooming by bringing the camera cone 1306 to the fore. However, it is not limited to this structure. The digital camera may have the structure in which an optical shooting system inside the casing 1307 enables the camera to take a picture in zooming without bringing the camera cone to the fore.

The viewfinder eyepiece 1311 is provided at the upper portion of the rear of the digital camera whereby the shooting range and the focusing point are checked by sight.

The operational button 1313 is provided on the rear of the digital camera and composed of various kinds of operational functions such as a setup button, a menu button, a display button, a function button, and a select button.

A digital camera can be manufactured at low costs with high throughput and high manufacturing yields by applying the display device that is one example of a semiconductor device according to the invention to a monitor A digital camera can be manufactured at low costs with high throughput and high manufacturing yields by applying the semiconductor device according to the invention to a CPU for processing in response to input operation of various function buttons, a main switch, a release button, and the like, a CPU for controlling various circuits such as a circuit for auto-focusing and auto-focusing adjustment, a timing control circuit for controlling electric flash drive and CCD drive, an imaging circuit for generating an image signal from a signal that is photo-electrically converted by an imaging device such as a CCD, an A/D converter circuit for converting an image signal generated in an imaging circuit into a digital signal or a memory interface for writing and reading image data in a memory.

Although the present invention has been fully described by way of examples with reference to the accompanying drawings, it is to be understood that various changes and modifications will be apparent to those skilled in the art. Therefore, unless otherwise such changes and modifications depart from the scope of the present invention hereinafter described, they should be construed as being included therein.

What is claimed is:

1. A method for manufacturing a wiring over a substrate comprising the steps of:
   forming a first conductive layer over an insulating surface;
   forming a first mask pattern over the first conductive layer;
   forming a second conductive layer having a first side surface having a first angle in a range of 85° to 90° with respect to a plane parallel to the insulating surface by etching the first conductive layer under a first etching condition; and
   forming a third conductive layer and a second mask pattern by etching the second conductive layer and the first mask pattern under a second condition,
   wherein the third conductive layer has at least a second side surface at a lower portion of the third conductive layer and a third side surface at an upper portion of the third conductive layer,
   wherein the second side surface has a second angle of inclination,
   wherein the third side surface has a third angle of inclination,
   wherein the second angle of inclination is different from the third angle of inclination, and
   wherein a second selective ratio under the second condition of the first mask pattern to the second conductive layer is larger than a first selective ratio under the first condition of the first mask pattern to the first conductive layer.

2. A method for manufacturing a wiring over a substrate comprising the steps of:
   forming a first conductive layer over an insulating surface;
   forming a first mask pattern over the first conductive layer;
   forming a second conductive layer having a side surface having an angle in a range of 85° to 90° with respect to a plane parallel to the insulating surface by etching the first conductive layer under a first etching condition;
   oxidizing a surface of the second conductive layer; and
   forming a third conductive layer and a second mask pattern by etching the second conductive layer and the first mask pattern under a second condition;
   wherein a second selective ratio under the second condition of the first mask pattern to the second conductive layer is larger than a first selective ratio under the first condition of the first mask pattern to the first conductive layer.

3. The method for manufacturing the wiring over the substrate according to any one of claims 1 and 2, wherein a mixed gas composed of an etching gas used in the first condition and an etching gas that yields a higher selective ratio of the first mask pattern to the first conductive layer than that under the first condition is used under the second condition.

4. The method for manufacturing the wiring over the substrate according to claim 3, wherein the etching gas used in the first condition is boron trichloride or chlorine, and the etching gas that yields the higher selective ratio of the first mask pattern to the first conductive layer than that under the first condition is one kind or a plurality of kinds selected from the group consisting of carbon tetrafluoride, sulfur fluoride, and oxygen.

5. The method for manufacturing the wiring over the substrate according to any one of claims 1 and 2, wherein the first conductive layer is a conductive layer containing aluminum.

6. A method for manufacturing a semiconductor device comprising the steps of:
   forming a first conductive layer over an insulating surface;
   forming a first mask pattern over the first conductive layer;
   forming a second conductive layer having a first side surface having a first angle in a range of 85° to 90° with respect to a plane parallel to the insulating surface by etching the first conductive layer under a first etching condition;
   forming a third conductive layer and a second mask pattern by etching the second conductive layer and the first mask pattern under a second condition; and
   forming an insulating layer by coating an insulating material after removing the second mask pattern,
   wherein the third conductive layer has at least a second side surface at a lower portion of the third conductive layer and a third side surface at an upper portion of the third conductive layer,
   wherein the second side surface has a second angle of inclination,
   wherein the third side surface has a third angle of inclination,
   wherein the second angle of inclination is different from the third angle of inclination, and
   wherein a second selective ratio under the second condition of the first mask pattern to the second conductive layer is larger than a first selective ratio under the first condition of the first mask pattern to the first conductive layer.

7. A method for manufacturing a semiconductor device comprising the steps of:
   forming a first conductive layer over an insulating surface;
   forming a first mask pattern over the first conductive layer;
   forming a second conductive layer having a side surface having an angle in a range of 85° to 90° with respect to a plane parallel to the insulating surface by etching the first conductive layer under a first etching condition;
   oxidizing a surface of the second conductive layer;
   forming a third conductive layer and a second mask pattern by etching the second conductive layer and the first mask pattern under a second condition; and
   forming an insulating layer by coating an insulating material after removing the second mask pattern;
   wherein a second selective ratio under the second condition of the first mask pattern to the second conductive layer is larger than a first selective ratio under the first condition of the first mask pattern to the first conductive layer.

8. The method for manufacturing the semiconductor device according to any one of claims 6 and 7, wherein a mixed gas composed of an etching gas used in the first condition and an etching gas that yields a higher selective ratio of the first mask pattern to the first conductive layer than that under the first condition is used under the second condition.

9. The method for manufacturing the semiconductor device according to claim 8, wherein the etching gas used in the first condition is boron trichloride or chlorine, and the etching gas that yields a higher selective ratio of the first mask pattern to the first conductive layer than that under the first condition is one or a plurality of kinds selected from the group consisting of carbon tetrafluoride, sulfur fluoride, and oxygen.

10. The method for manufacturing the semiconductor device according to any one of claims 6 and 7, wherein the first conductive layer is a conductive layer containing aluminum.

* * * * *